(12) United States Patent
Li et al.

(10) Patent No.: US 12,230,634 B2
(45) Date of Patent: Feb. 18, 2025

(54) SEMICONDUCTOR DEVICES AND METHODS OF FABRICATING THE SAME

(71) Applicant: Taiwan Semiconductor Manufacturing Company, Ltd., Hsinchu (TW)

(72) Inventors: Ming-Shuan Li, Hsinchu County (TW); Tsung-Lin Lee, Hsinchu (TW); Chih Chieh Yeh, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 638 days.

(21) Appl. No.: 17/465,443

(22) Filed: Sep. 2, 2021

(65) Prior Publication Data
US 2022/0285346 A1    Sep. 8, 2022

Related U.S. Application Data

(60) Provisional application No. 63/156,494, filed on Mar. 4, 2021.

(51) Int. Cl.
*H01L 27/092*   (2006.01)
*H01L 21/02*    (2006.01)
(Continued)

(52) U.S. Cl.
CPC ........ *H01L 27/092* (2013.01); *H01L 21/0259* (2013.01); *H01L 21/823807* (2013.01);
(Continued)

(58) Field of Classification Search
CPC ....... H01L 21/823481; H01L 21/76224; H01L 29/0649; H01L 29/0653; H01L 21/823878;
(Continued)

(56) References Cited

U.S. PATENT DOCUMENTS

| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |

(Continued)

FOREIGN PATENT DOCUMENTS

| TW | 202017185 A | 5/2020 |
| TW | 202038331 A | 10/2020 |

*Primary Examiner* — John A Bodnar
(74) *Attorney, Agent, or Firm* — HAYNES AND BOONE, LLP

(57) ABSTRACT

A semiconductor structure and a method of forming the same are provided. In an embodiment, an exemplary semiconductor structure includes a number of channel members over a substrate, a gate structure wrapping around each of the number of channel members, a dielectric fin structure disposed adjacent to the gate structure, the dielectric fin structure includes a first dielectric layer disposed over the substrate and in direct contact with the first gate structure, a second dielectric layer disposed over the first dielectric layer, and a third dielectric layer. The third dielectric is disposed over the second dielectric layer and spaced apart from the first dielectric layer and the gate structure by the second dielectric layer. The dielectric fin structure also includes an isolation feature disposed directly over the third dielectric layer.

20 Claims, 28 Drawing Sheets

(51) Int. Cl.
  *H01L 21/8238*  (2006.01)
  *H01L 29/06*  (2006.01)
  *H01L 29/423*  (2006.01)
  *H01L 29/66*  (2006.01)
  *H01L 29/786*  (2006.01)

(52) U.S. Cl.
  CPC .. *H01L 21/823878* (2013.01); *H01L 29/0665* (2013.01); *H01L 29/42392* (2013.01); *H01L 29/66742* (2013.01); *H01L 29/78618* (2013.01); *H01L 29/78696* (2013.01)

(58) Field of Classification Search
  CPC ........... H01L 21/76283; H01L 29/6656; H01L 21/27832
  See application file for complete search history.

(56) References Cited

U.S. PATENT DOCUMENTS

| | | |
|---|---|---|
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2007/0082489 A1* | 4/2007 | Tsao ................. H01L 21/76802 438/689 |
| 2019/0296123 A1* | 9/2019 | Lee ...................... H01L 29/512 |
| 2020/0135572 A1 | 4/2020 | Chung et al. |
| 2020/0335596 A1 | 10/2020 | Yin et al. |
| 2020/0411668 A1 | 12/2020 | Tang |
| 2021/0242093 A1* | 8/2021 | Lin ................. H01L 21/823864 |
| 2021/0343600 A1* | 11/2021 | Chen ................. H01L 29/78696 |

* cited by examiner

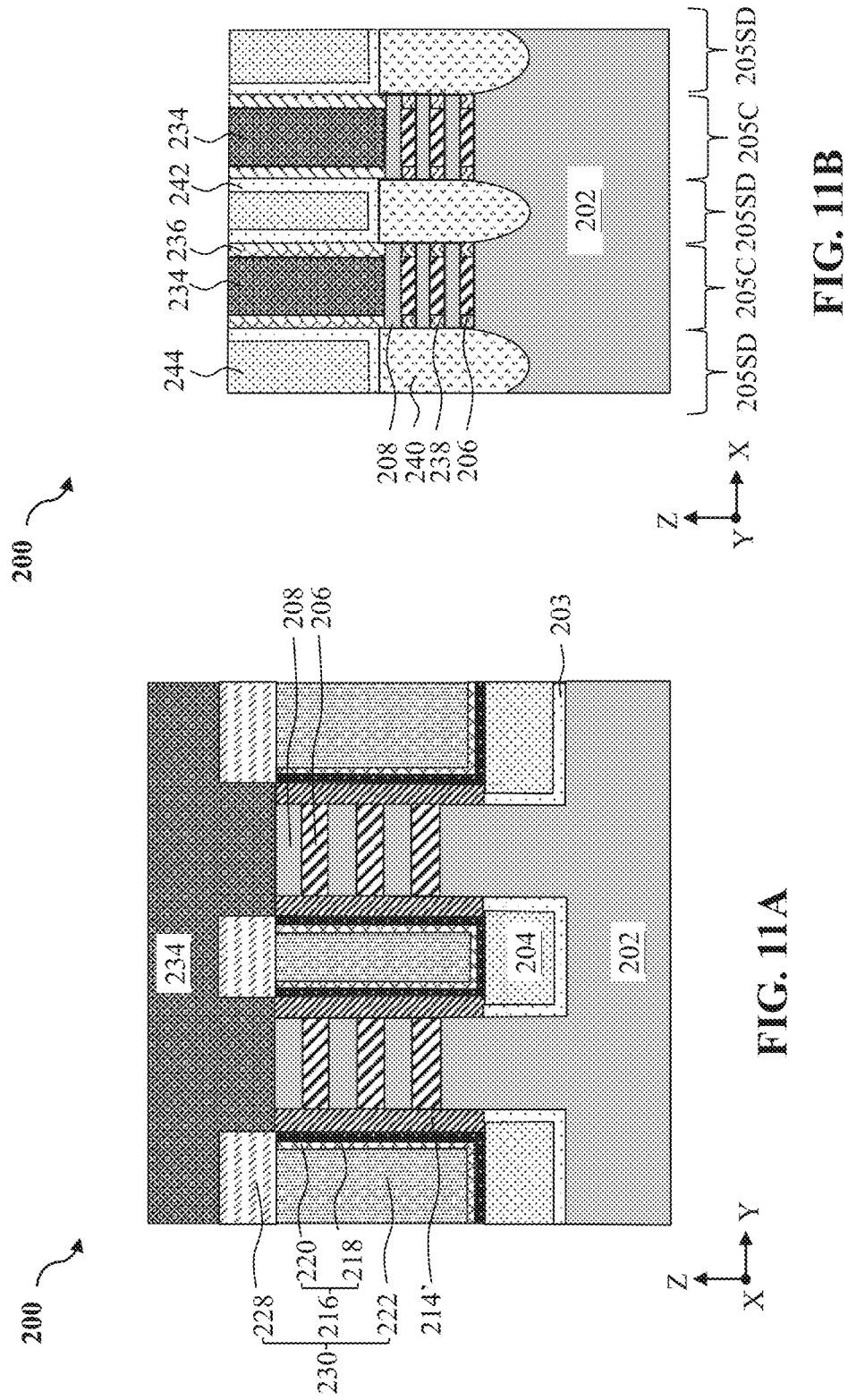

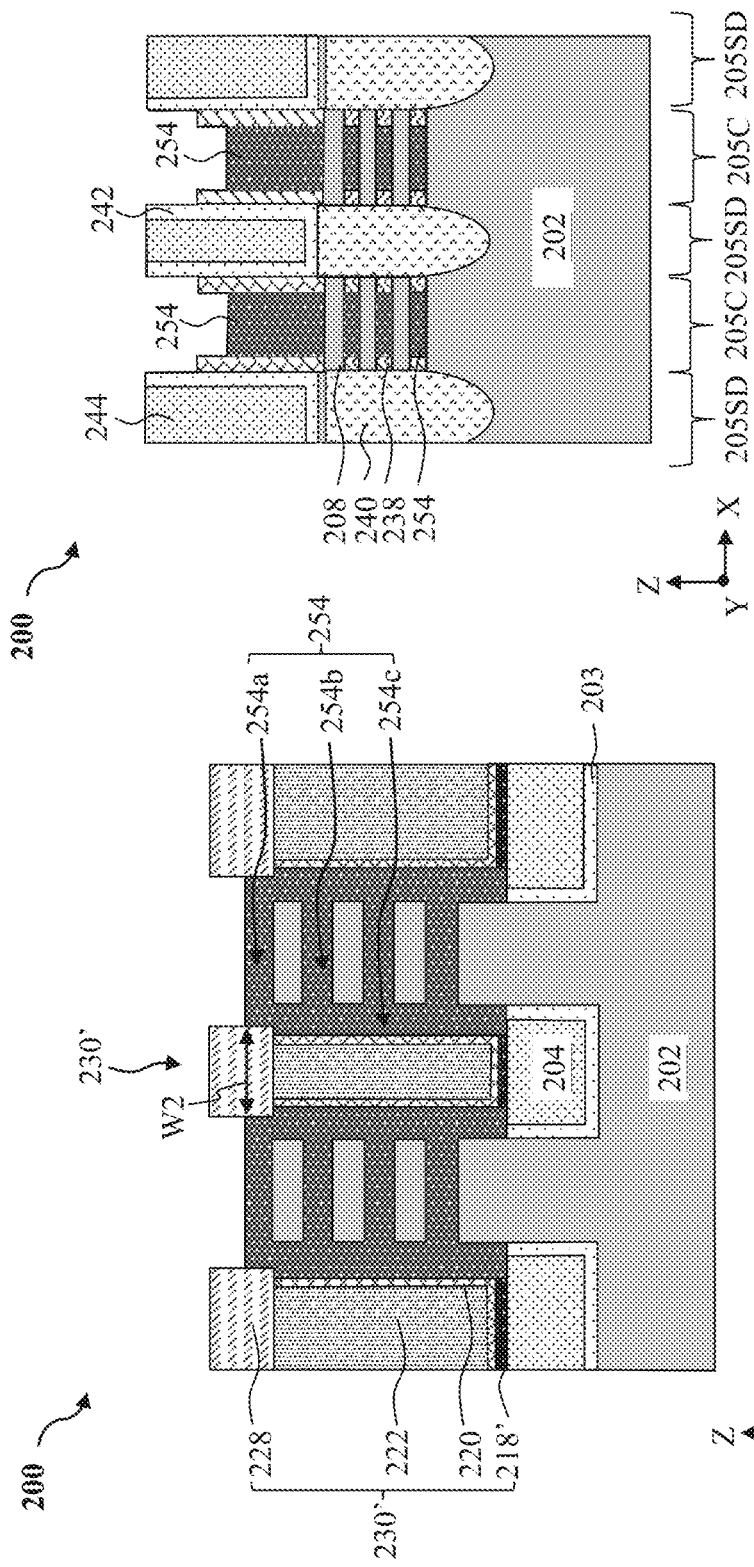

SEMICONDUCTOR DEVICES AND METHODS OF FABRICATING THE SAME

PRIORITY

This application claims the priority to U.S. Provisional Application Ser. No. 63/156,494, filed Mar. 4, 2021, entitled "Semiconductor Devices and Methods of Fabricating the Same," the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as semiconductor devices continue to scale, challenges arise in achieving desired density and performance. The desired density and performance also demand effective and precise etching process. However, due to densely spaced features and reduced process windows, some sacrificial features may not be substantially removed in a predetermined etching duration and some residues may remain, preventing satisfactory formation of functional structures, such as gate structures. While over-etching may reduce undesirable residual sacrificial features, adjacent features may suffer damages. Accordingly, although existing devices and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 11A, 12A, 13A, 14A and 15A (FIGS. 11A-15A) illustrate fragmentary cross-sectional views of the exemplary workpiece taken along line A-A' as shown in FIG. 2 during various fabrication stages in the method of FIG. 1, according to one or more aspects of the present disclosure.

FIGS. 11B, 12B, 13B, 14B and 15B (FIGS. 11B-15B) illustrate fragmentary cross-sectional views of the exemplary workpiece taken along line B-B' as shown in FIG. 2 during various fabrication stages in the method of FIG. 1, according to one or more aspects of the present disclosure.

DETAILED DESCRIPTION

Figure 1:
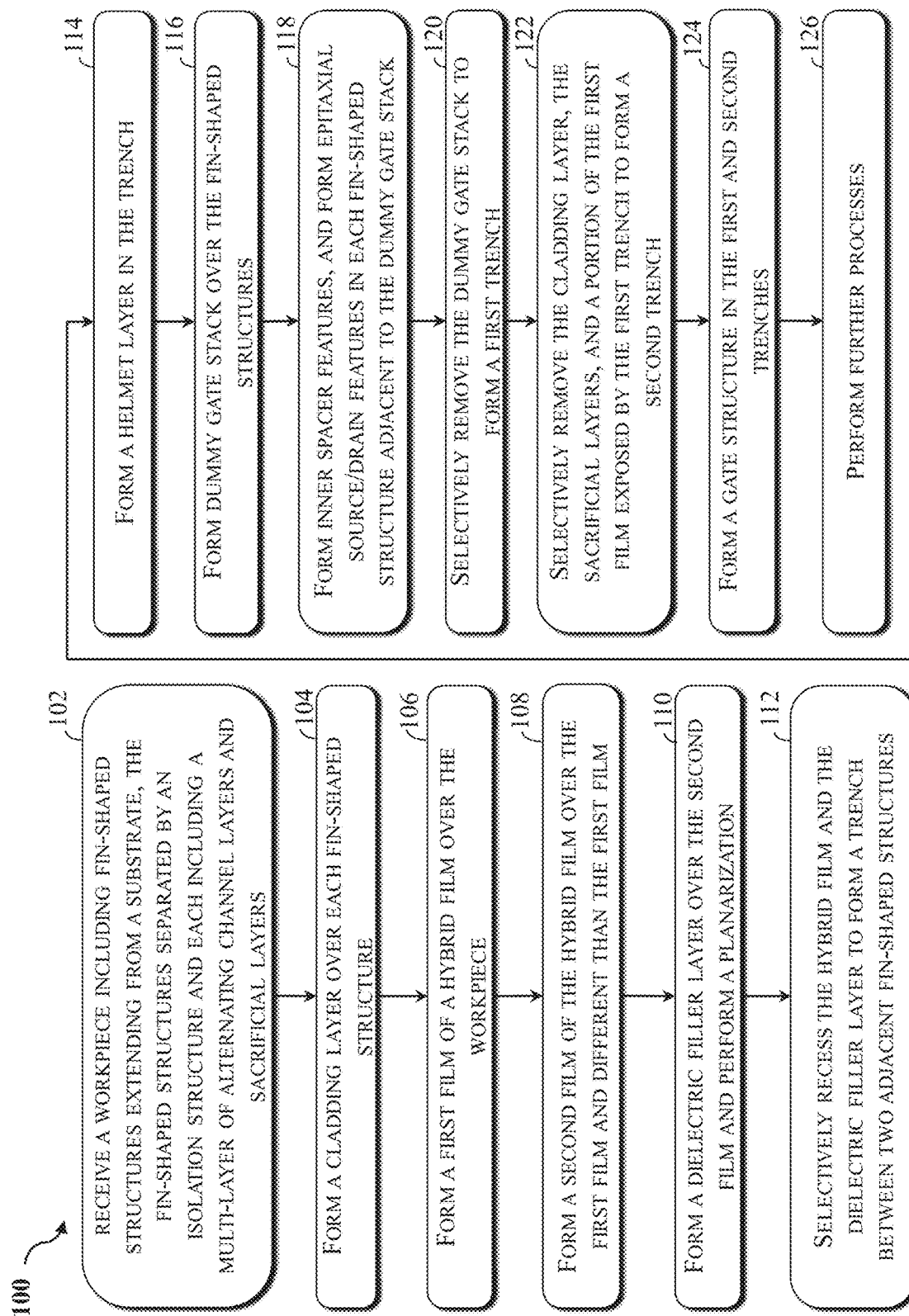
FIG. 1 illustrates a flowchart of an exemplary method for fabricating a semiconductor structure, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Multi-gate devices, such as a multi-bridge-channel (MBC) transistor (also known as a gate-all-around (GAA) transistor, a nanosheet transistor, a nanowire transistor, or a surrounding gate transistor (SGT)), have been introduced to improve gate control by increasing gate-channel coupling, reducing off-state current, and reducing short-channel effects (SCEs). Formation of an MBC transistor includes formation of a stack that includes a number of channel layers interleaved by a number of sacrificial layers, where the sacrificial layers may be selectively removed to release the channel layers as channel members. A gate structure, which includes multiple dielectric and conductive layers, is then formed to wrap around each of the channel members. As described above, aggressive scaling down of IC dimensions has resulted in densely spaced features. For example, the dimensions of each stack and the space between two adjacent stacks are reduced. Due to the densely spaced features, an etching window for removing the sacrificial layers is also reduced, leading to a portion of the sacrificial layers remain in the channel region (e.g., residues) after the channel release process. The residues of the sacrificial layers may disadvantageously prevent the gate structure from being formed around some of the bottom channel members, thereby leading to a non-uniform gate control and thus unsatisfactory device performance. Without changing the footprint of the device and without affecting the electrical isolation between two adjacent transistors, one possible method of substantially avoiding such residue may include reducing the dimensions (e.g., width) of each stack to increase the space between two adjacent stacks and thus increase the etching window. However, such method would provide a decreased channel width, leading to a degraded device performance.

The present disclosure provides semiconductor devices and methods for increasing an etching window associated with the channel release process. An exemplary method for forming a semiconductor device includes forming a number of semiconductor fin-shape stacks protruding from a substrate, where each of the number of fin-shape stacks includes a vertical semiconductor stack of alternating channel layers and sacrificial layers. The exemplary method also includes forming a cladding layer along sidewalls of each stack, conformally depositing a hybrid film over the substrate. The hybrid film includes a first film and a second film on the first film. The first film may be selectively removed during an etching process employed in the channel release process. The exemplary method also includes forming a dielectric filler layer over the hybrid film to fill the space between two adjacent semiconductor fin-shape stacks, selectively recessing the dielectric filler layer and the hybrid film to form a trench, forming a helmet layer in the trench, selectively removing the cladding layer, a portion of the first film extending along sidewalls of the cladding layer, and the sacrificial layers to form openings, and forming a gate structure in the openings. Forming the hybrid film that can be partially removed during the channel release process may facilitate removal of the sacrificial layers and formation of satisfactory gate structures.

The various aspects of the present disclosure will now be described in more detail with reference to the figures. In that regard, FIG. 1 is a flowchart illustrating method 100 of forming a semiconductor device according to embodiments of the present disclosure. Method 100 is described below in conjunction with FIGS. 2-10, FIGS. 11A-15A, FIGS. 11B-15B and FIGS. 16-28 (FIGS. 2-28), which are fragmentary top views or cross-sectional views of a workpiece 200 at different stages of fabrication according to embodiments of method 100. Method 100 is merely an example and is not intended to limit the present disclosure to what is explicitly illustrated therein. Additional steps may be provided before, during and after the method 100, and some steps described can be replaced, eliminated, or moved around for additional embodiments of the method. Not all steps are described herein in detail for reasons of simplicity. Because the workpiece 200 will be fabricated into a semiconductor device 200 upon conclusion of the fabrication processes, the workpiece 200 may be referred to as the semiconductor device 200 as the context requires. For avoidance of doubts, the X, Y and Z directions in FIGS. 2-28 are perpendicular to one another and are used consistently throughout FIGS. 2-28. Throughout the present disclosure, like reference numerals denote like features unless otherwise excepted.

Figure 2:
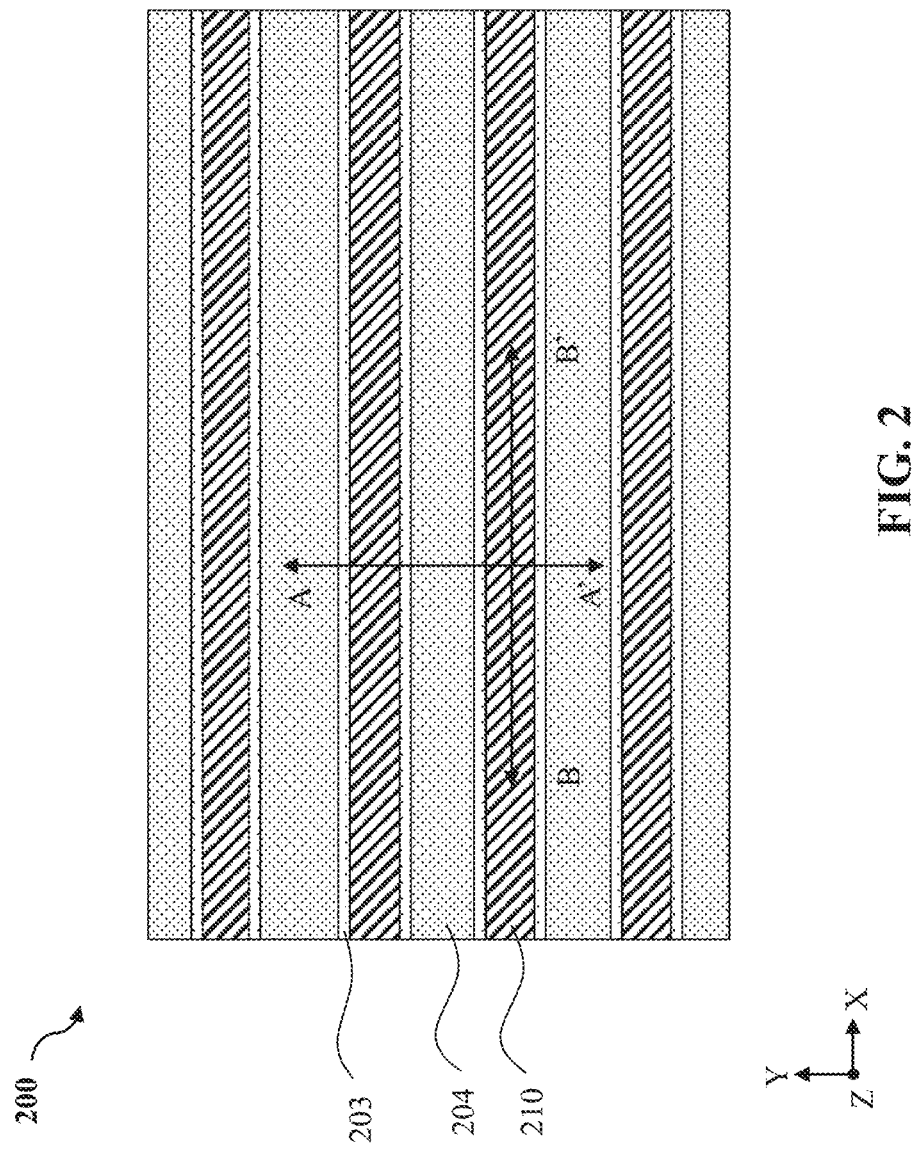
FIG. 2 is a fragmentary planar top view of an exemplary workpiece to undergo various stages of operations in the method of FIG. 1, according to various aspects of the disclosure.
Figure 3:
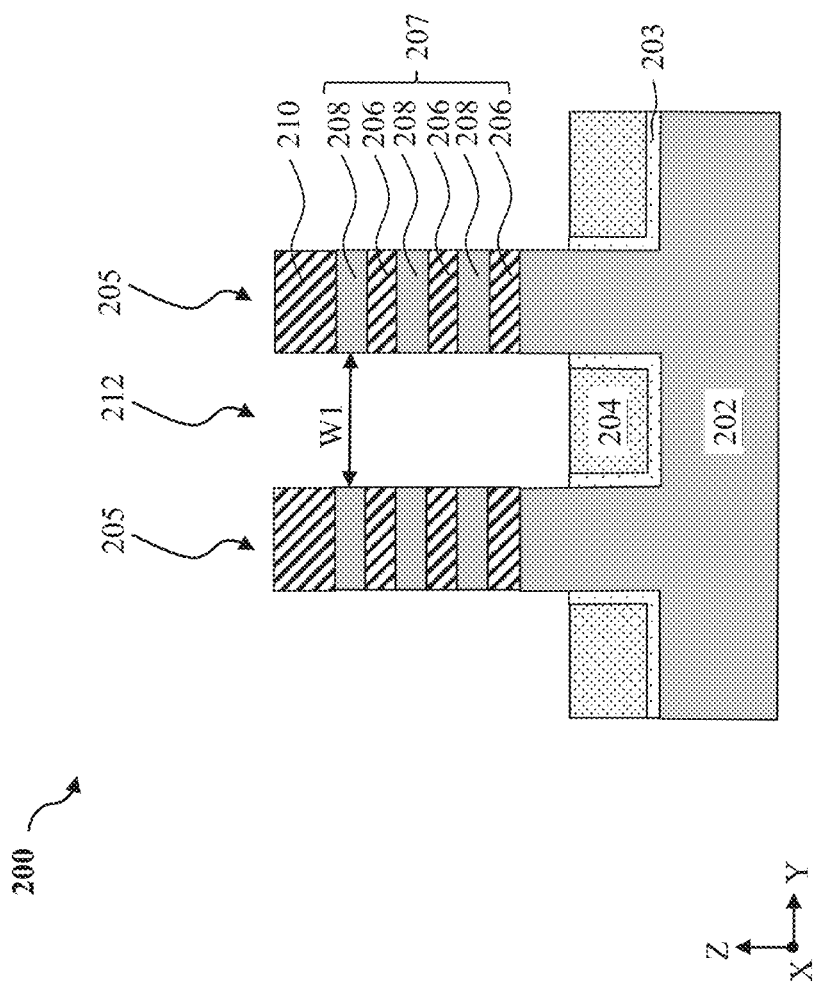
FIGS. 3, 4, 5, 6, 7, 8, 9, and 10 (FIGS. 3-10) illustrate fragmentary cross-sectional views of the exemplary workpiece taken along line A-A' as shown in FIG. 2 during various fabrication stages in the method of FIG. 1, according to one or more aspects of the present disclosure.

Referring to FIGS. 1, 2, and 3, method 100 includes a block 102 where a workpiece 200 is received. FIG. 2 depicts a top view of an exemplary workpiece 200 and FIG. 3 depicts a cross-sectional view of the workpiece 200 taken along line A-A' as shown in FIG. 2. In embodiments represented in FIG. 3, the workpiece 200 includes a substrate 202. In an embodiment, the substrate 202 is a bulk silicon substrate. The substrate 202 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the substrate 202 may be a semiconductor-on-insulator substrate, such as a silicon-on-insulator (SOI) substrate, a silicon germanium-on-insulator (SGOI) substrate, or a germanium-on-insulator (GOI) substrate.

The workpiece 200 includes a number of fin-shaped structures 205 disposed over the substrate 202. Each fin-shaped structure 205 extends lengthwise along the X direction and is divided into channel regions 205C (shown in FIG. 11B) and sources/drain regions 205SD. The fin-shaped structure 205 may be formed from a portion of the substrate 202, a vertical semiconductor stack 207, as well as a topmost layer 210 over the stack 207 using a combination of lithography and etch steps. In the depicted embodiment, the stack 207 may include a number of channel layers 208 interleaved by a number of sacrificial layers 206. Each channel layers 208 may include a semiconductor material such as, silicon, germanium, silicon carbon, silicon germanium, or other suitable semiconductor materials, or combinations thereof, while each sacrificial layer 206 has a composition different from that of the channel layer 208. The channel layers 208, the sacrificial layers 206, and the topmost layer 210 may be epitaxially deposited on the substrate 202 using molecular beam epitaxy (MBE), vapor-phase epitaxy (VPE), ultra-high vacuum CVD (UHV-CVD), and/or other suitable epitaxial growth processes. In the present embodiments, the topmost layer 210 is also a sacrificial layer configured to facilitate the formation of a helmet layer (discussed in detail below). In some embodiments, the thickness of the topmost layer 210 is greater than a thickness of the sacrificial layer 206 and/or the channel layer 208. The topmost layer 210 may include any suitable material, such as a semiconductor material, so long as its composition is distinct from that of the helmet layer and the channel layer 208 disposed thereunder to allow selective removal by an etching process. In some embodiments, the topmost layer 210 has a composition similar to or the same as that of the sacrificial layers 206. In this depicted example, the channel layer 208 is formed of silicon (Si), the sacrificial layer 206 and the topmost layer 210 are formed of silicon germanium (SiGe).

The fin-shaped structures 205 are separated by an isolation structure 204. The isolation structure 204 may include silicon oxide, tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), a low-k dielectric material (having a dielectric constant less than that of silicon oxide, which is about 3.9), other suitable materials, or combinations thereof. The isolation structure 204 may include shallow trench isolation (STI) features. In one embodiment, the isolation structure 204 are formed by filling trenches that separate the fin-shaped structures 205 with a dielectric material described above by any suitable method, such as CVD, flowable CVD (FCVD), spin-on-glass (SOG), other suitable methods, or combinations thereof. The dielectric material may subsequently be planarized by a chemical-mechanical planarization/polishing (CMP) process and selectively etched back to form the isolation structure 204. The isolation structure 204 may include a single-layer structure or a multi-layer structure.

In embodiments represented in FIG. 3, the workpiece 200 includes a liner 203. The liner 203 may include silicon oxide or other suitable material. The liner 203 may be formed by conformally depositing a dielectric material layer over the workpiece 200 before the formation of the isolation structure 204. The dielectric material layer may be etched back to form the liner 203. In an embodiment, the liner 203 is formed of silicon oxide deposited by PECVD, ALD, or other suitable material, and the isolation structure 204 is formed of silicon oxide deposited by flowable CVD. The liner 203 is denser than the isolation structure 204 to provide a better device performance. A trench 212 is defined by the top surface of the liner 203 and the isolation structure 204 and the sidewall surfaces of two adjacent fin-shaped structures 205. A width of the trench 212 along the Y direction is marked as W1.

Figure 4:
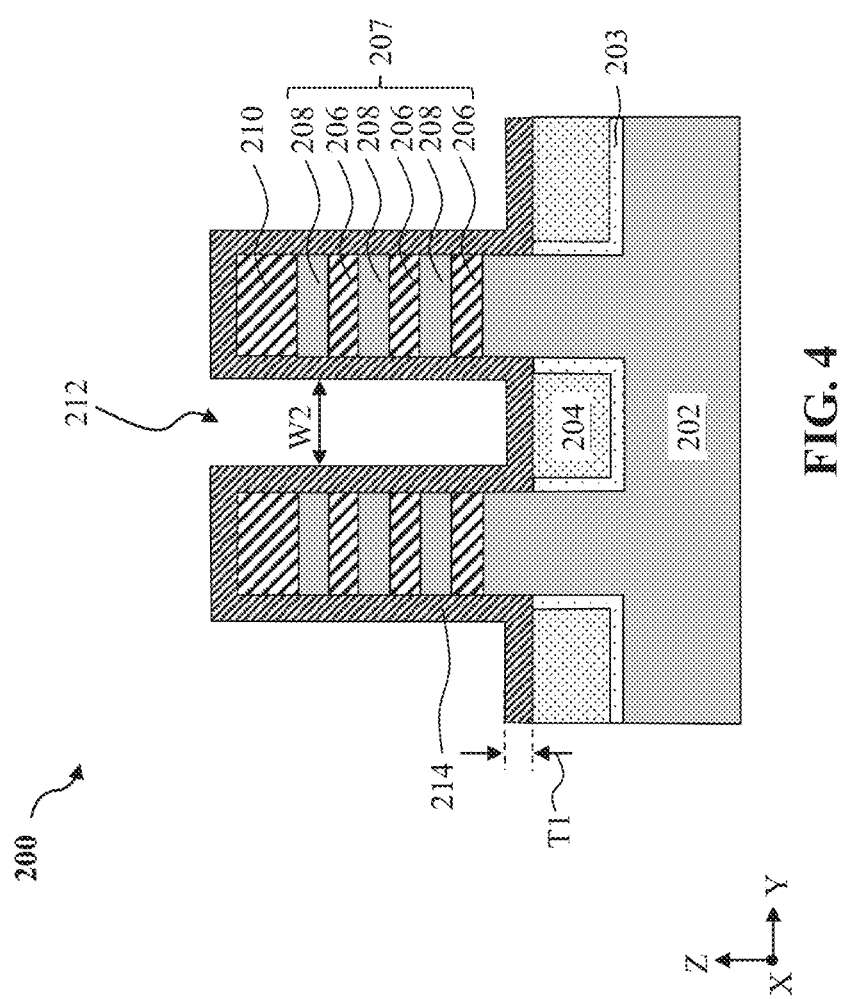
Figure 5:
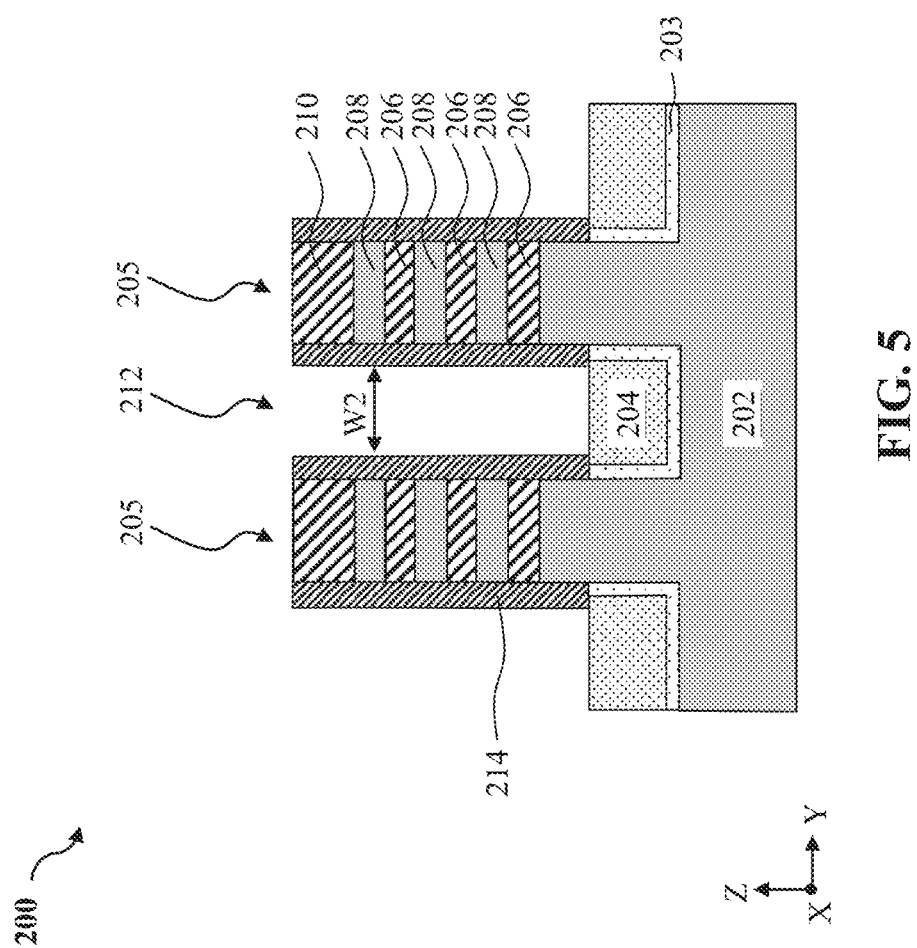

Referring to FIGS. 1 and 4-5, method 100 includes a block 104 where a cladding layer 214 is formed over the workpiece 200 and extending along sidewall surfaces of each fin-shaped structures 205. In the present embodiments, the cladding layer 214 may have a composition substantially the same as that of the sacrificial layer 206, such that they may be selectively removed by a common etching process. In the present embodiment, the cladding layer 214 is formed of SiGe. The cladding layer 214 may be formed epitaxially by a suitable method discussed above with respect to forming the stack 207. In some embodiments, referring to FIG. 4, a cladding layer 214 is deposited conformally over surfaces of the semiconductor device 200, such that the cladding layer 214 is also formed over the isolation structure 204 and the liner 203. In some examples, a thickness T1 of the cladding layer 214 may be between about 10 nm and about 20 nm. Subsequently, referring to FIG. 5, an anisotropic etching process is performed to selectively remove portions of the cladding layer 214 that are not extending along sidewalls of the fin-shaped structures 205, thereby exposing portions of the isolation structure 204 and a top surface of the topmost layer 210. The etching process may include a dry etching process, such as an RIE process. In the present embodiment, portions of the cladding layer 214 partially fill the trench 212. A width of the unfilled portion of the trench 212 along the Y direction is now marked as W2. W1 equals to the sum of W2 and twice of T1. That is, W1=W2+2*T1.

Figure 6:
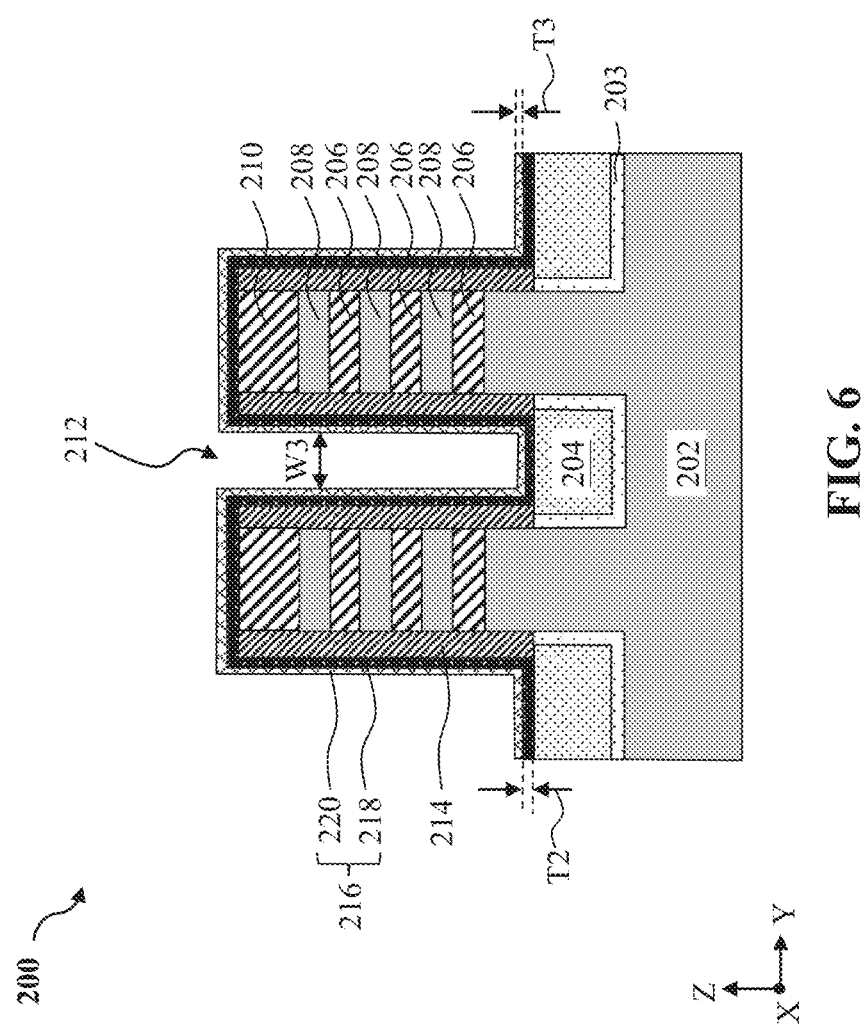

Referring to FIGS. 1 and 6, method 100 includes a block 106 where a first film 218 of a hybrid film 216 is formed over the workpiece 200. In an embodiment, the first film 218 is conformally deposited to have a generally uniform thickness T2 over the top surface of the workpiece 200 (e.g., having substantially the same thickness on top surface of the isolation structure 204, the top surfaces of fin-shaped structures 205, and top and sidewall surfaces of the cladding layer 214) and partially fills the trench 212. In some implementations, T2 is between about 1 nm and 3 nm such that an etching window for removing sacrificial layers 206 may be enlarged without significantly reducing the dimension of the to-be-formed second film 220 (to be described below). In some embodiments, the first film 218 may be formed by performing a deposition process such as a CVD process, a PVD process, an ALD process, or other suitable deposition process. The first film 218 may include silicon nitride, silicon oxycarbonitride (SiOCN), or other suitable materials. It is noticed that, in situation where the cladding layer 214 includes silicon germanium, the composition of the first film 218 would be substantially free of oxygen to reduce or substantially prevent silicon germanium in the cladding layer 214 from being oxidized. In the present embodiment, the first film 218 includes silicon nitride. When the first film 218 is formed of silicon oxycarbonitride, a carbon concentration of the silicon oxycarbonitride may be less than about 3%. For example, in some embodiments, the carbon concentration of the silicon oxycarbonitride may be between about 1% and about 3%.

Still referring to FIGS. 1 and 6, method 100 includes a block 108 where a second film 220 of the hybrid film 216 is formed over the first film 218. In an embodiment, the second film 220 is conformally deposited over the first film 218 to have a generally uniform thickness T3 and partially fills the trench 212. The second film 220 is surrounded by the first film 218. In some implementations, T3 is between about 3 nm and 6 nm such that the second film 220 may be thick enough to protect the to-be-formed dielectric filler layer 222 from being etched in a subsequence process. The partially filled trench 212 has a width W3 along the Y direction. In some embodiments, the second film 220 may be formed by performing a deposition process such as a CVD process, a PVD process, an ALD process, or other suitable deposition process. The second film 220 may include silicon carbon nitride (SiCN), silicon oxycarbonitride (SiOCN), boron nitride (BN), or other suitable materials. When the second film 220 is formed of silicon oxycarbonitride, a carbon concentration of the silicon oxycarbonitride may be between about 5% and about 15%. The second film 220 is configured to protect the cladding layer 214 from oxidization and keep the integrity of the to-be-formed dielectric filler layer 222. Since there is an etch selectivity between the first film 218 and the second film 220 of the hybrid film 216, and the second film 220 is less easily to be removed than the first film 218 with respect to an etching process employed in the channel release process (to be described in detail with reference to FIG. 13A), the first film 218 may be referred to as a soft film 218, and the second film 220 may be referred to as a hard film 220. A width of the unfilled portion of the trench 212 along the Y direction is now marked as W3. W2 equals to the sum of W3 and twice of the thickness of the hybrid film 216. That is, W2=W3+2*(T2+T3).

Figure 7:
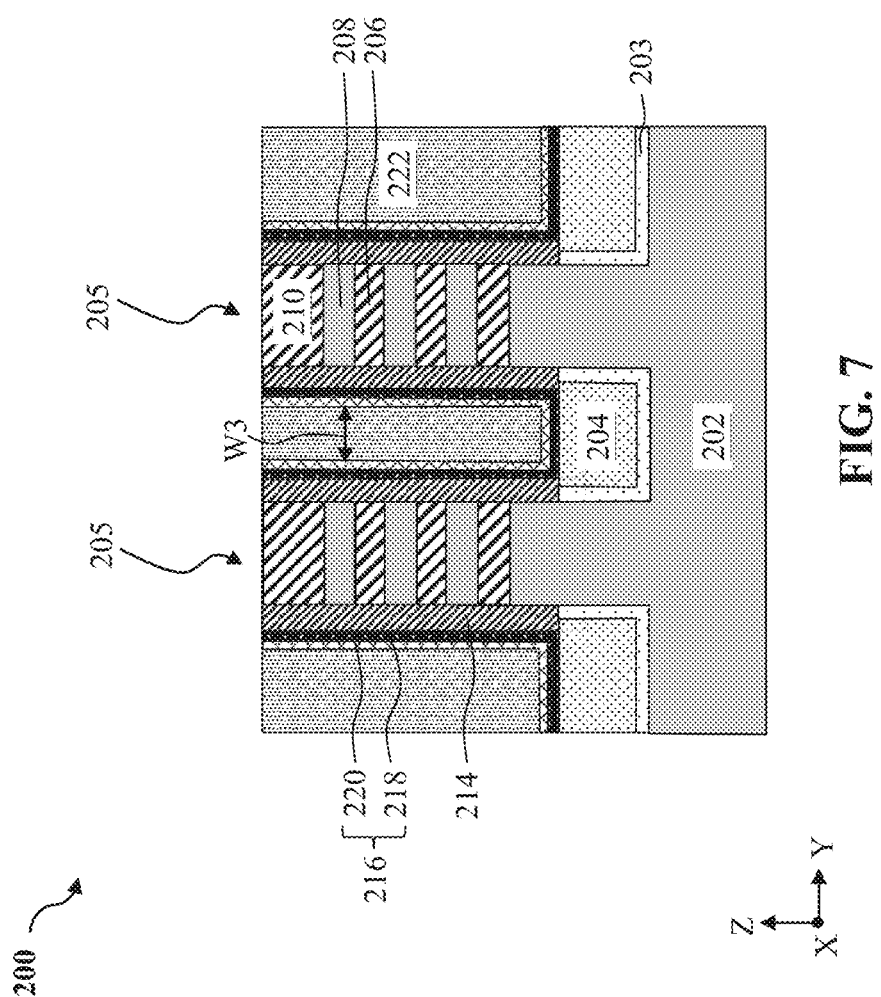

Referring to FIGS. 1 and 7, method 100 includes a block 110 where a dielectric filler layer 222 is formed over the hybrid film 216 to substantially completely fill the trench 212. The dielectric filler layer 222 is deposited over the workpiece 200 using CVD, SACVD, FCVD, ALD, spin-on coating, and/or other suitable process. The dielectric filler layer 222 is configured to isolate adjacent fin-shaped structures 205 and work with a helmet layer to cut a gate structure over the adjacent fin-shaped structures 205. The dielectric filler layer 222 may include silicon oxide, silicon carbide, FSG, or other suitable dielectric material. In some embodiments, a composition of the dielectric filler layer 222 may be in a way similar to that of the isolation structure 204. For example, the dielectric filler layer 222 may be formed of silicon oxide. After the deposition of dielectric filler layer 222, a planarization process, such as a chemical mechanical polishing (CMP) process, may be performed to planarize the workpiece 200 to remove excessive materials and expose a top surface of the topmost layer 210. The dielectric filler layer 222 thus has a width W3 along the Y direction. As depicted herein, the dielectric filler layer 222 is separated from each sidewall of the fin-shaped structures 205 by the cladding layer 214 and the hybrid film 216.

Figure 8:
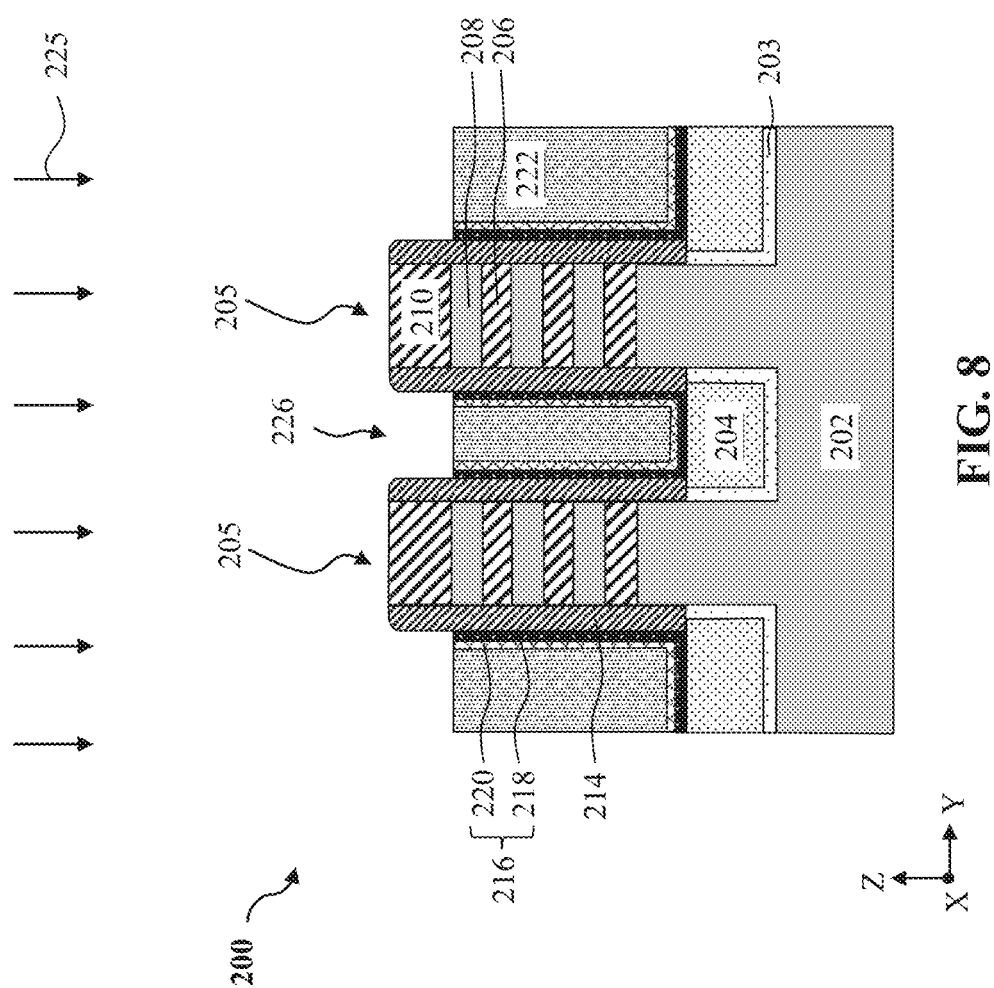

Referring to FIGS. 1 and 8, method 100 includes a block 112 where the hybrid film 216 and the dielectric filler layer 222 are selectively recessed to form a trench 226 between two adjacent fin-shaped structures 205 using an etching process 225. As shown in FIG. 8, a top surface of the recessed hybrid film 216 and the recessed dielectric filler layer 222 is substantially co-planar with the topmost channel layer 208. In other words, the resulting trench 226 (between two adjacent fin-shaped structures 205) formed over the recessed dielectric filler layer 222 has a width equal to W2 and may have a depth corresponding to the thickness of the topmost layer 210. The etching process 225 may include any suitable process, such as a dry etching process, a wet etching process, other suitable processes, or combinations thereof. The trench 226 with different configurations (e.g., shape, dimensions) are described in further detail below (trench 310 in FIG. 16, trench 405 in FIG. 22, and trench 505 in FIG. 26).

Figure 9:
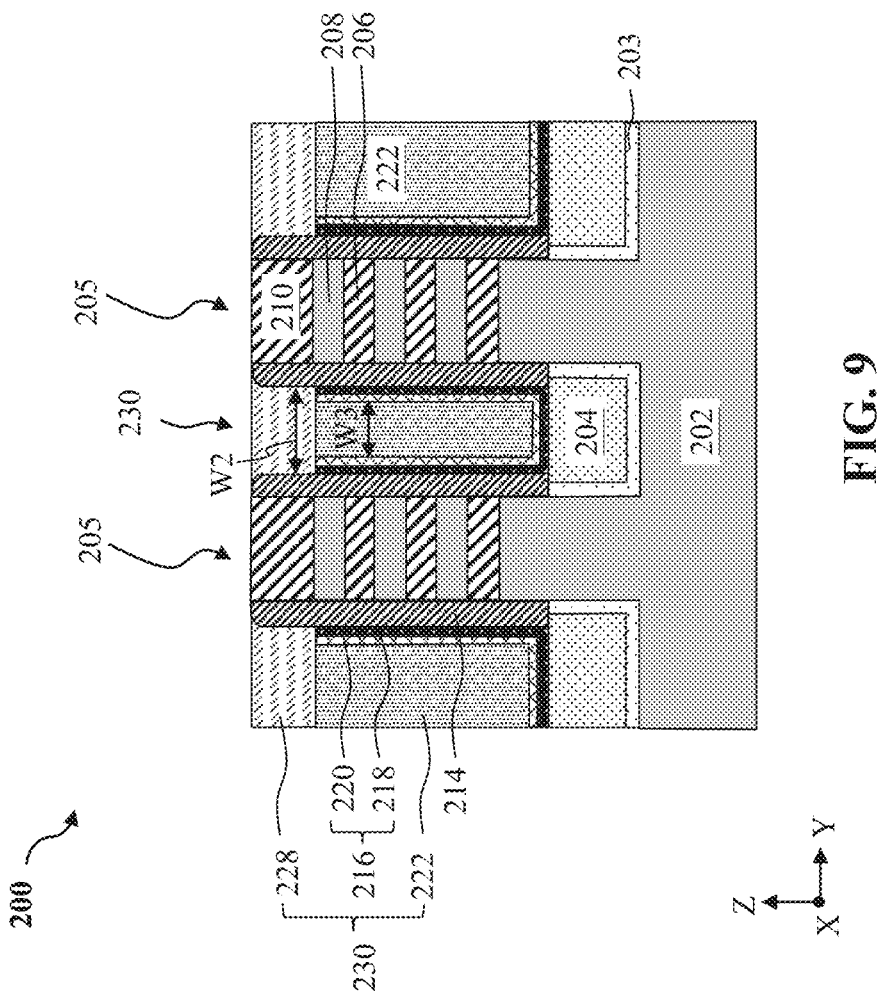

Referring to FIGS. 1 and 9, method 100 includes a block 114 where a helmet layer 228 is formed in the trench 226. The helmet layer 228 is deposited over the workpiece 200, thereby filling the trench 226 between the fin-shaped structures 205. The helmet layer 228 is separated from the sidewalls of the fin-shaped structures 205 by portions of the cladding layer 214 and has a width W2 along the Y direction. The helmet layer 228 may be a high-K dielectric layer and may include aluminum oxide, aluminum nitride, aluminum oxynitride, zirconium oxide, zirconium nitride, zirconium aluminum oxide, hafnium oxide, other high-k material, or a suitable dielectric material. The helmet layer 228 may be deposited by a CVD process, an ALD process, a PVD process, and/or other suitable process. The workpiece 200 is then planarized using a CMP process to remove excessive helmet layer 228 on the topmost layer 210. In the present embodiment, the helmet layer 228 is configured to provide isolation for a to-be-formed gate structure 254 over the fin-shaped structures 205. In other words, the helmet layer 228 is configured to truncate a gate structure 254, which is formed at a subsequent processing step, into multiple portions. The helmet layer 228 may be referred to as a gate isolation feature or a gate cut feature. At this point, the dielectric fins 230 are substantially formed. Each of the dielectric fins 230 includes a helmet layer 228 disposed directly over the dielectric filler layer 222 and the hybrid film 216 and has a uniform width W2 bottom to top.

Figure 10:
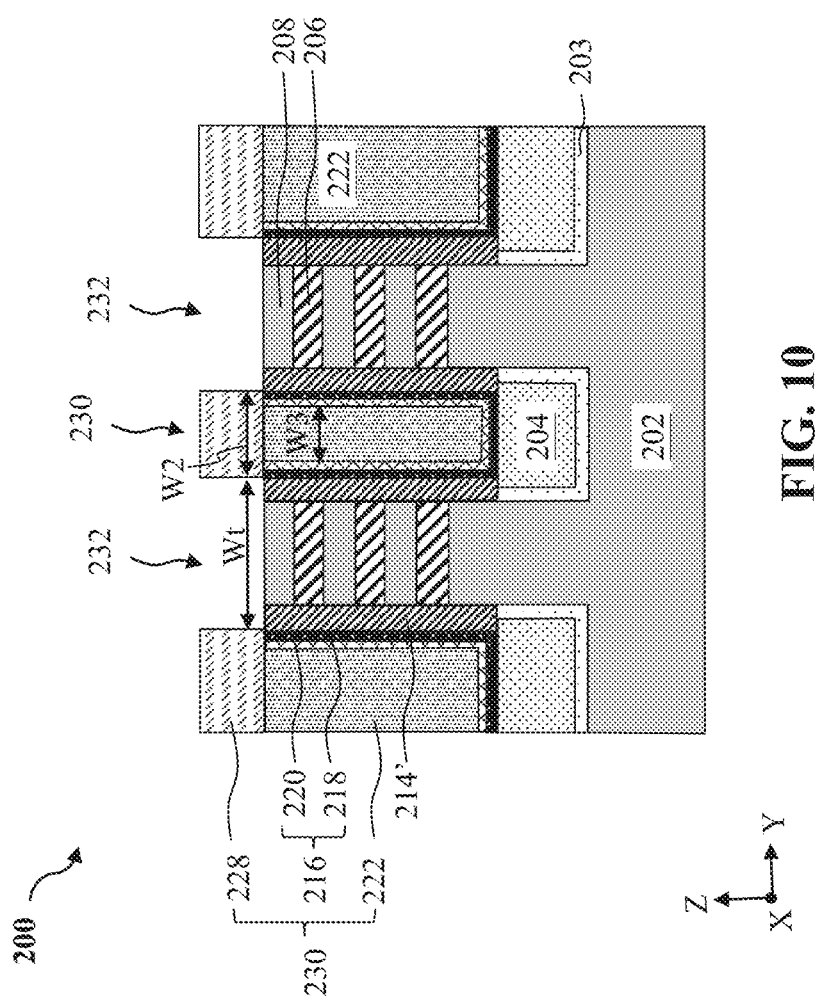

Referring to FIGS. 1, 10, and 11A-11B, method 100 includes a block 116 where a dummy gate stack 234 is formed over the workpiece 200. With reference to FIG. 10, the workpiece 200 is etched to selectively remove the topmost layer 210 and a portion of the cladding layer 214 that extends along the sidewalls of the topmost layer 210 to form a trench 232 without substantially etching the helmet layer 228 or the topmost channel layer 208. The trench 232 exposes the topmost channel layer 208 and has a width $W_t$ along the Y direction. In some implementations, the etch process may include a selective dry etching process. In some implementations, the etch process may include a selective wet etching process (e.g., selective to SiGe) that includes ammonium hydroxide (NH$_4$OH), hydrogen fluoride (HF), hydrogen peroxide (H$_2$O$_2$), or a combination thereof. The partially recessed cladding layer 214 may be referred to as cladding layer 214'. The cladding layer 214' and the topmost channel layer 208 are substantially co-planar.

As shown in FIGS. 11A-11B, a dummy gate stack 234 is formed over channel regions 205C of the fin-shaped structures 205. In this embodiment, a gate replacement process (or gate-last process) is adopted where the dummy gate stack 234 serves as a placeholder for a functional gate structure 254. Other processes and configuration are possible. While not explicitly shown, the dummy gate stack 234 may include a dummy dielectric layer and a dummy electrode disposed over the dummy dielectric layer. The regions of the fin-shaped structures 205 underlying the dummy gate stack 234 may be referred to as channel regions 205C. Each of the channel regions 205C in a fin-shaped structure 205 is sandwiched between a source region 205SD and a drain region 205SD. In some embodiments, the dummy dielectric layer may include silicon oxide and the dummy electrode may include polycrystalline silicon (polysilicon). After the dummy gate stack 234 is formed, a gate spacer 236 may be formed along sidewalls of the dummy gate stack 234. The gate spacer 236 may include two or more gate spacer layers. Dielectric materials for the gate spacer 236 may be selected to allow selective removal of the dummy gate stack 234 without substantially damaging the gate spacer 236. Suitable dielectric materials may include silicon nitride, silicon oxycarbonitride, silicon carbonitride, silicon oxide, silicon oxycarbide, silicon carbide, silicon oxynitride, and/or combinations thereof.

Referring to FIGS. 1 and 11B, method 100 includes a block 118 where inner spacer features 238 and epitaxial source/drain features 240 are formed in each fin-shaped structure 205 adjacent to the dummy gate stack 234. With the dummy gate stack 234 and the gate spacer 236 serving as an etch mask, the workpiece 200 is anisotropically etched in the source/drain regions 205SD of the fin-shaped structures 205 to form source/drain openings (filled by source/drain features 240). The anisotropic etch in block 118 may include a dry etching process and may implement hydrogen, a fluorine-containing gas (e.g., CF$_4$, SF$_6$, CH$_2$F$_2$, CHF$_3$, and/or C$_2$F$_6$), a chlorine-containing gas (e.g., Cl$_2$, CHCl$_3$, CCl$_4$, and/or BCl$_3$), a bromine-containing gas (e.g., HBr and/or CHBr$_3$), an iodine-containing gas, other suitable gases and/or plasmas, and/or combinations thereof. Source/drain openings may not only extend through the stack 207, but also extend through a portion of the substrate 202.

After forming source/drain openings, the sacrificial layers 206 exposed in the source/drain openings are selectively and partially recessed to form inner spacer recesses (filled by inner spacer features 238), while the exposed channel layers 208 are substantially unetched. In some embodiments, this selective recess may include a selective isotropic etching process (e.g., a selective dry etching process or a selective wet etching process), and the extent at which the sacrificial layers 206 is recessed is controlled by duration of the etching process. After the formation of the inner spacer recesses, an inner spacer material layer is then conformally deposited using CVD or ALD over the workpiece 200, including over and into the inner spacer recesses. The inner spacer material may include silicon nitride, silicon oxycarbonitride, silicon carbonitride, silicon oxide, silicon oxycarbide, silicon carbide, or silico oxynitride. After the deposition of the inner spacer material layer, the inner spacer material layer is etched back to form inner spacer features 238, as illustrated in FIG. 11B.

Still referring to FIGS. 1 and 11B, source/drain features 240 are formed in the source/drain openings by using an epitaxial process, such as VPE, UHV-CVD, MBE, and/or other suitable processes. The source/drain features 240 are therefore coupled to the channel layers 208 in the channel regions 205C of the fin-shape structures 205. Depending on the conductivity type of the to-be-formed transistor, the source/drain features 240 may be n-type source/drain features or p-type source/drain features. Exemplary n-type source/drain features may include silicon, phosphorus-doped silicon, arsenic-doped silicon, antimony-doped silicon, or other suitable material and may be in-situ doped during the epitaxial process by introducing an n-type dopant, such as phosphorus, arsenic, or antimony, or ex-situ doped using a junction implant process. Exemplary p-type source/drain features may include germanium, gallium-doped silicon germanium, boron-doped silicon germanium, or other suitable material and may be in-situ doped during the epitaxial process by introducing a p-type dopant, such as boron or gallium, or ex-situ doped using a junction implant process.

Still referring to FIGS. 1 and 11B, a contact etch stop layer (CESL) 242 and an interlayer dielectric (ILD) layer 244 are deposited over the workpiece 200. The CESL 242 may include silicon nitride, silicon oxynitride, and/or other suitable materials and may be formed by ALD, plasma-enhanced chemical vapor deposition (PECVD) process and/or other suitable deposition or oxidation processes. As shown in FIG. 11B, the CESL 242 may be deposited on top surfaces of the source/drain features 240 and sidewalls of the gate spacer 236. The ILD layer 244 is deposited by a PECVD process or other suitable deposition technique over the workpiece 200 after the deposition of the CESL 242. The ILD layer 244 may include materials similar to that of the isolation structure 204.

Figures 12A, 12B:
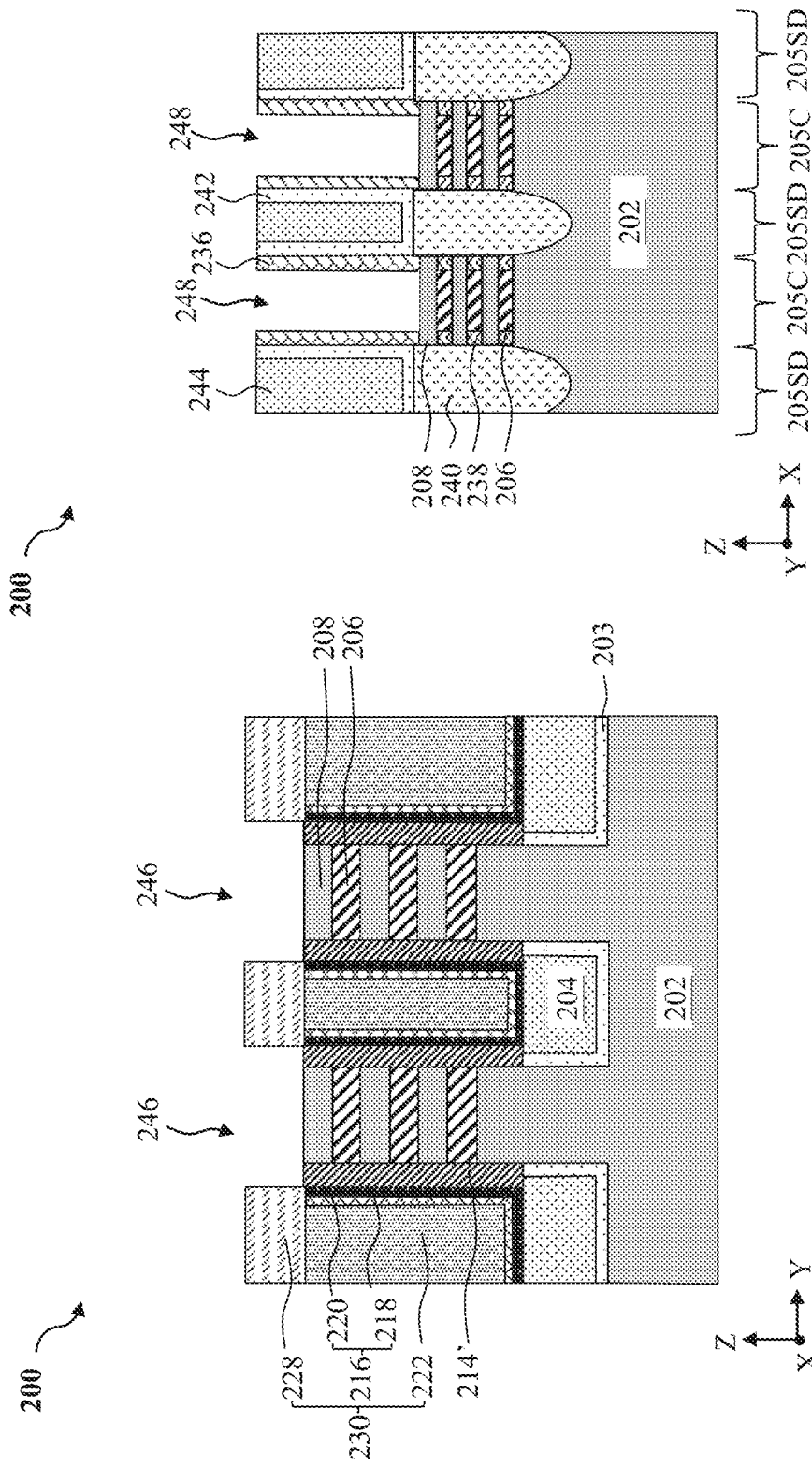

Referring to FIGS. 1 and 12A-12B, method 100 includes a block 120 where the dummy gate stack 234 is selectively removed. The removal of the dummy gate stack 234 forms a trench 246 between two adjacent helmet layers 228 and an opening 248 over the channel region 205C. The etching process may include any suitable process, such as a dry etching process, a wet etching process, or combinations thereof, and is configured to selectively remove the dummy gate stacks 234 without substantially removing the helmet layer 228, the topmost channel layer 208, the gate spacers 236, the CESL 242, or the ILD layer 244. The trench 246 exposes the cladding layer 214' and the topmost channel layer 208. The soft film 218 is disposed directly under the helmet layer 228.

Figures 13A, 13B:
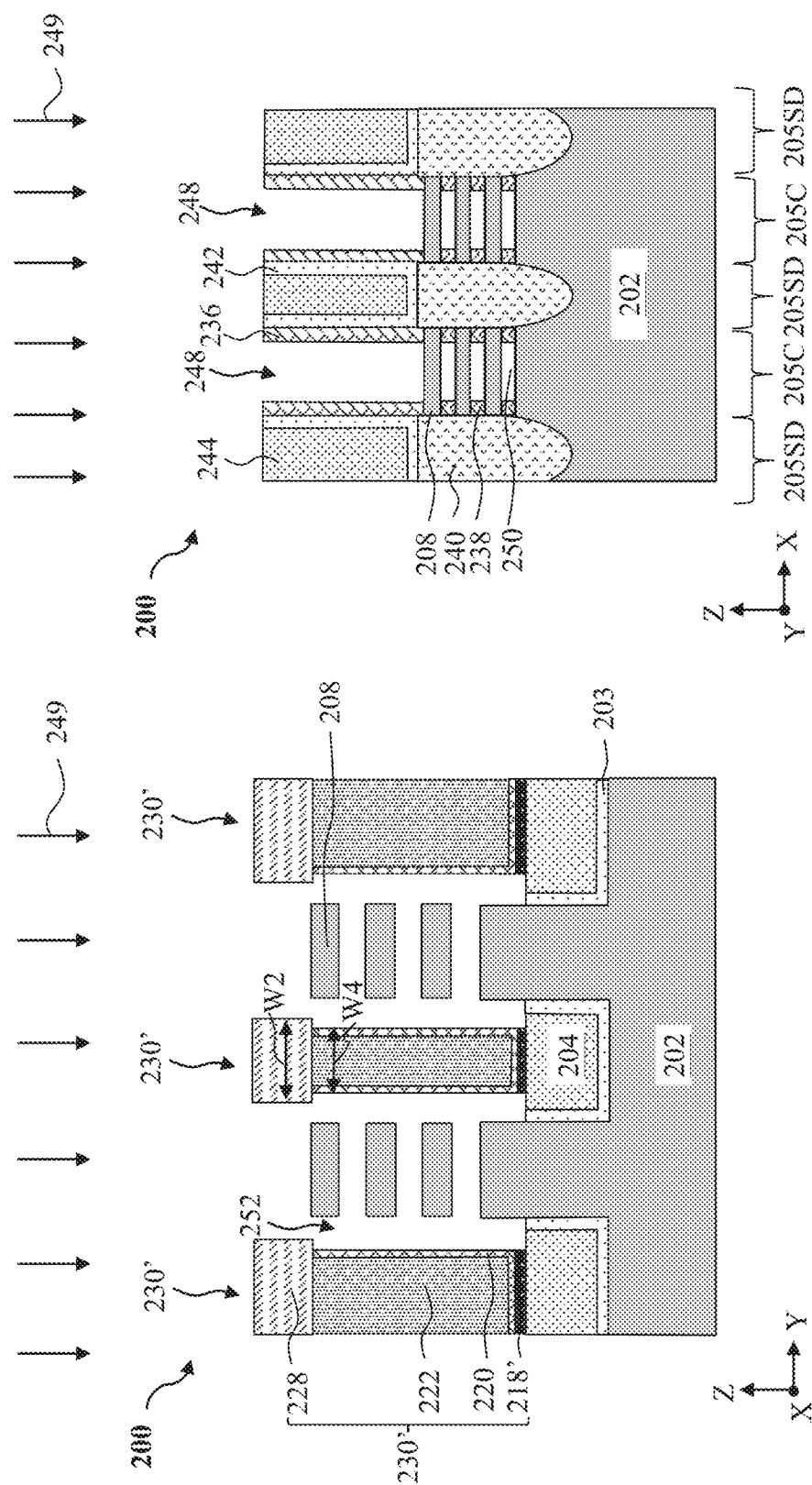

Referring to FIGS. 1 and 13A-13B, method 100 includes a block 122 where the sacrificial layers 206 are selectively removed to form a number of openings 250 interleaved with the channel layers 208 without substantially removing the channel layers 208 by an etching process 249. In the present embodiments, the etching process 249 in this channel release process also removes the cladding layer 214', which has a composition similar to or the same as that of the sacrificial layers 206. In some embodiments, the etching process 249 includes in a series of etching processes such as selective dry etching, selective wet etching, or other selective etching processes. In one example, a wet etching process employing an oxidant such as ammonium hydroxide (NH$_4$OH), ozone (O$_3$), nitric acid (HNO$_3$), hydrogen peroxide (H$_2$O$_2$), other suitable oxidants, and a fluorine-based etchant such as hydrofluoric acid (HF), ammonium fluoride (NH$_4$F), other suitable etchants, or combinations thereof may be performed to selectively remove the sacrificial layers 206 and the cladding layer 214'.

Due to the employment of the etching process 249, a portion of the soft film 218 that extends along the sidewall of the cladding layer 214' is also selectively removed together with the cladding layer 214' to form an enlarged trench 252. The hard film 220 remains substantially unetched. With the removal of the sacrificial layers 206, the cladding layer 214' and the portion of the soft film 218 extending along the sidewall of the cladding layer 214', the trench 252 exposes the liner 203, the isolation structure 204, the channel members 208 and sidewall surface of the hard film 220. The remaining soft film 218 may be referred to as soft film 218'. As shown in FIG. 13A, the soft film 218' remains vertically sandwiched between the isolation structure 204 and a horizontal or bottom portion of the hard film 220. The trench 252 exposes the sidewall surface of the soft film 218'. The resulting dielectric fin 230 may be referred to as dielectric fin 230'. Due to the partial removal of the soft film 218, the width of the dielectric fin 230' is no longer uniform. More specifically, the width W2 of the helmet layer 228 of the dielectric fin 230' is greater than the width W4 of the rest of the dielectric fin 230'. That is, the helmet layer 228 overhangs the rest of the dielectric fin 230'. A width difference between the helmet layer 228 and the rest of the dielectric fin 230' is substantially equal to twice of the thickness T2 (i.e., 2*T2) of the soft film 218. That is, W2=W4+2*T2. By selectively and partially removing the soft film 218, the etching window for selectively removing the sacrificial layers 206 is thus enlarged. Therefore, the sacrificial layers 206 may be substantially removed and no significant residues would remain in the channel region 205C.

Figures 14A, 14B:
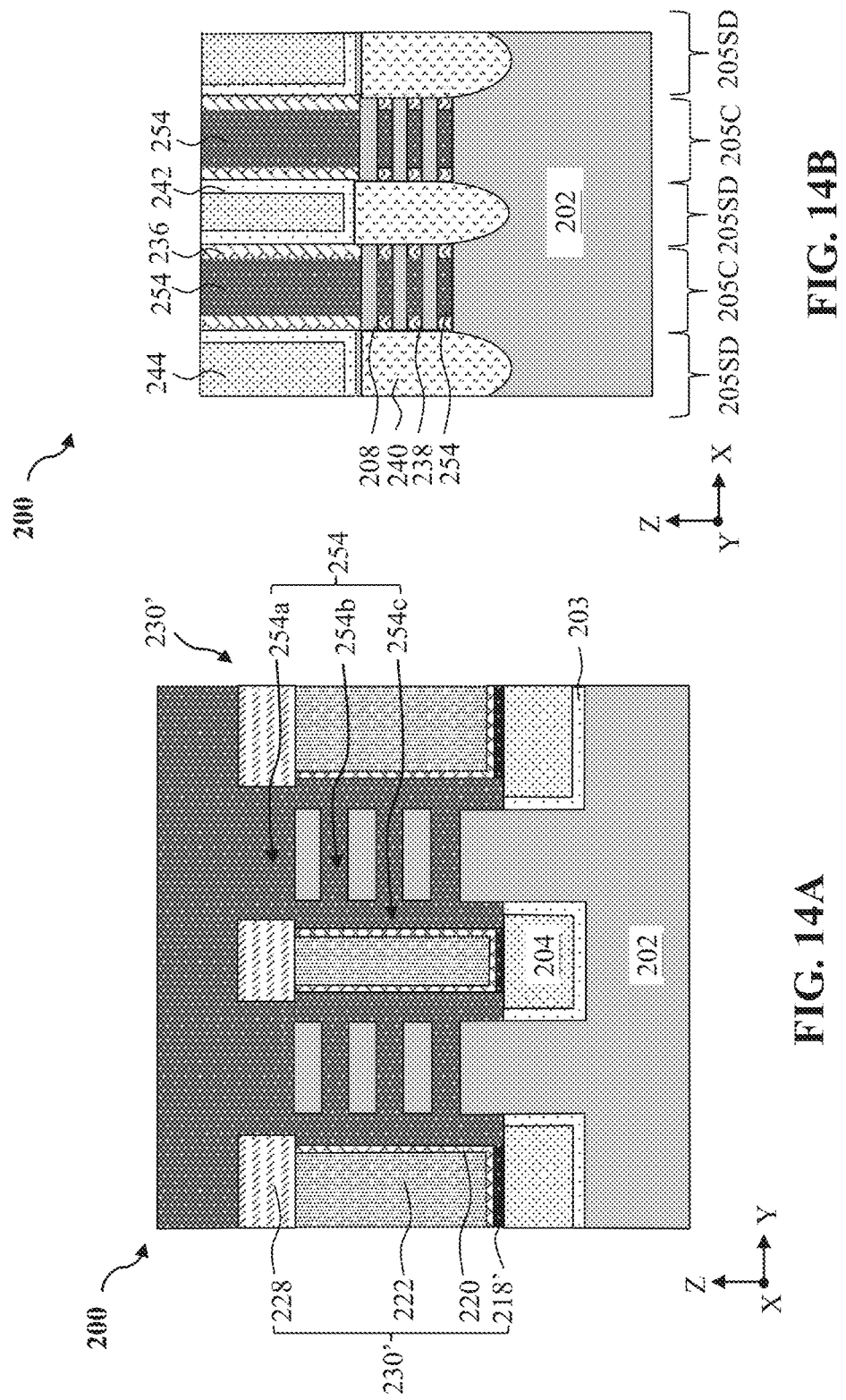

Referring to FIGS. 1 and 14A-14B, method 100 includes a block 124 where a gate structure 254 is formed over the workpiece 200 to wrap around each of the channel members 208. The gate structure 254 may include an interfacial layer, a gate dielectric layer over the interfacial layer, and a gate electrode layer over the gate dielectric layer. In some embodiments, the interfacial layer may include silicon oxide. The gate dielectric layer is then deposited over the interfacial layer using ALD, CVD, and/or other suitable methods. The gate dielectric layer may include high-K dielectric materials. As used herein, high-k dielectric materials include dielectric materials having a high dielectric constant, for example, greater than that of thermal silicon oxide (~3.9). In one embodiment, the gate dielectric layer may include hafnium oxide. Alternatively, the gate dielectric layer may include other high-k dielectrics, such as titanium oxide (TiO$_2$), hafnium zirconium oxide (HfZrO), tantalum oxide (Ta$_2$O$_5$), hafnium silicon oxide (HfSiO$_4$), zirconium oxide, zirconium silicon oxide (ZrSiO$_2$), lanthanum oxide (La$_2$O$_3$), aluminum oxide (Al$_2$O$_3$), yttrium oxide (Y$_2$O$_3$), SrTiO$_3$ (STO), BaTiO$_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)TiO$_3$ (BST), silicon nitride (SiN), silicon oxynitride (SiON), combinations thereof, or other suitable material. A gate electrode layer is deposited over the gate dielectric layer. The gate electrode layer may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process. In various embodiments, a planarization process, such as a CMP process, may be performed to remove excessive materials to provide a substantially planar top surface of the gate structures.

As shown in FIGS. 14A and 14B, the gate structure 254 includes a top portion 254a disposed over the channel members 208, a bottom portion 254b wrapping around each of the channel members 208, and a sidewall portion 254c connecting the top portion 254a and the bottom portion 254b. The sidewall portion 254c fills the trench 252 and tracks the shape of the trench 252. That is, the sidewall portion 254c is in direct contact with the dielectric fin 230' and is partially disposed directly under the helmet layer 228. More specifically, the sidewall portion 254c directly contacts the vertical portion of the hard film 220 that extends along the Z direction. The sidewall portion 254c also directly contacts the sidewall of the soft film 218' disposed between the isolation structure 204 and the hard film 220. The dielectric filler layer 222 is spaced apart from the sidewall portion 254c of the gate structure 254 and the soft film 218' by the hard film 220. The sidewall portion 254c may also be referred to as an end cap portion 254c or a gate end cap portion 254c.

Referring to FIGS. 1 and 15A-15B, method 100 includes a block 124 where further processes may be performed to complete the fabrication of the semiconductor device 200. For example, as shown in FIGS. 15A-15B, method 100 may further include recessing the gate structure 254 in an etching process, thereby exposing the top surface of the helmet layer 228. That is, a top surface of the gate structure 254 is lower than a top surface of the helmet layer 228. Thus, the gate structure 254 is truncated into multiple electrically isolated portions. Such further processes may also include forming various contacts/vias, metal lines, power rails, as well as other multilayer interconnect features, such as ILD layers and/or etch stop layer (ESLs) over the semiconductor device 200, configured to connect the various features to form a functional circuit that includes the different semiconductor devices.

In the embodiments described above, the helmet layer 228 has a uniform width W2 and overhangs the rest of the dielectric fin 230'. That is, the width W2 of the helmet layer 228 is greater than a width W4 of the rest of the dielectric fin 230'. The helmet layer 228 may be configured to have different dimensions and shapes to further facilitate the flow of chemicals employed in the etching process 249 in the channel release process. FIGS. 16-28 each illustrate alternative embodiments to further facilitate the removal of the sacrificial layers 206, according to one or more aspects of the present disclosure. The processes described in block 116, 118 and 120 of FIG. 1 are omitted below for reason of simplicity.

Figure 16:
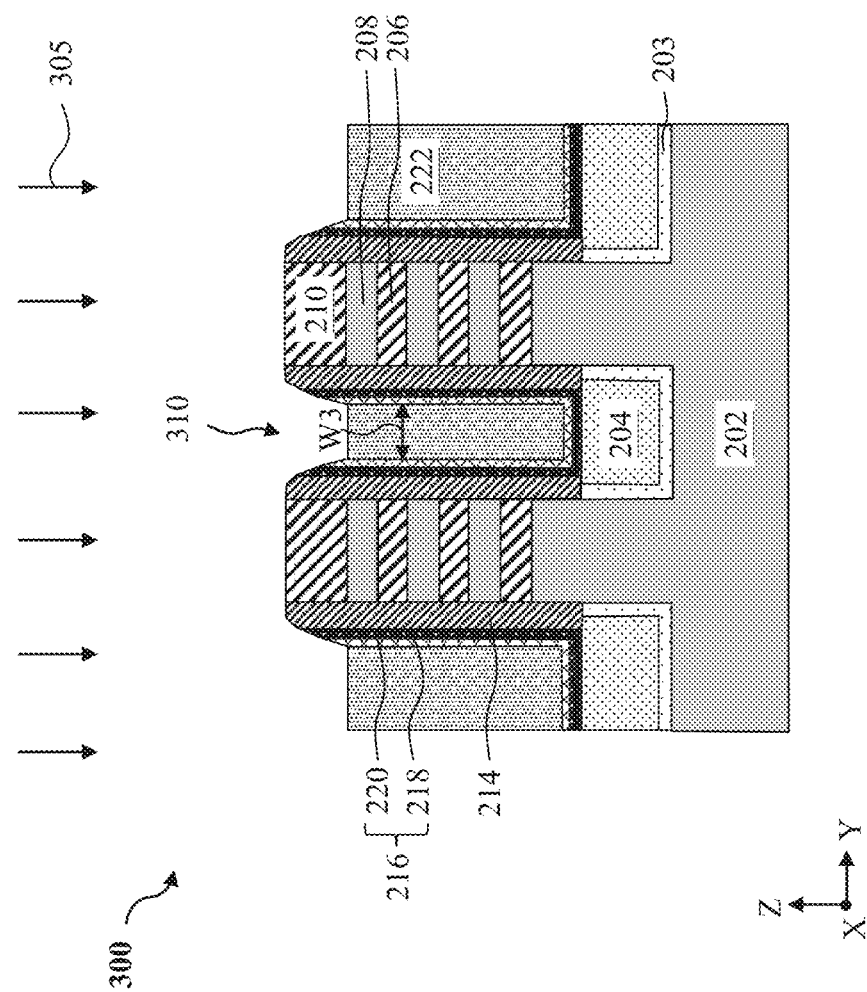
FIGS. 16, 17, 18, 19, and 20 (FIGS. 16-20), FIGS. 21, 22, 23, and 24 (FIGS. 21-24), FIGS. 25, 26, 27, and 28 (FIGS. 25-28) illustrate a corresponding first, second, and third alternative embodiment of the exemplary workpiece taken along line A-A' as shown in FIG. 2 during various fabrication stages in the method of FIG. 1, according to one or more aspects of the present disclosure.

FIGS. 16-20 illustrate a first alternative embodiment of an exemplary workpiece 300 taken along line A-A' as shown in FIG. 2 during various fabrication stages in the method of FIG. 1. Referring to FIGS. 1 and 16, method 100 includes a block 112 where the hybrid film 216 and the dielectric filler layer 222 are selectively recessed to form a trench 310 between the fin-shaped structures 205 using an etching process 305. It is noted that, different from the workpiece 200 shown in FIG. 8, a top surface of the dielectric filler layer 222 in workpiece 300 is substantially co-planar with the topmost channel layer 208, while a top surface of the recessed hybrid film 216 in workpiece 300 is not co-planar with the topmost channel layer 208. More specifically, a top surface of the hybrid film 216 is tilted and higher than the top surface of the topmost channel layer 208. As shown in FIG. 16, after the etching process 305, a tapered trench 310 is formed between the fin-shaped structures 205. The etching process 305 is different from the etching process 225 and may include any suitable process, such as a dry etching process. In some embodiment, etching process 305 may implement any suitable etching, such as a fluorine-containing etchant (e.g., HF, $CF_4$, other fluorine-containing etchants, or combinations thereof)).

Figure 17:
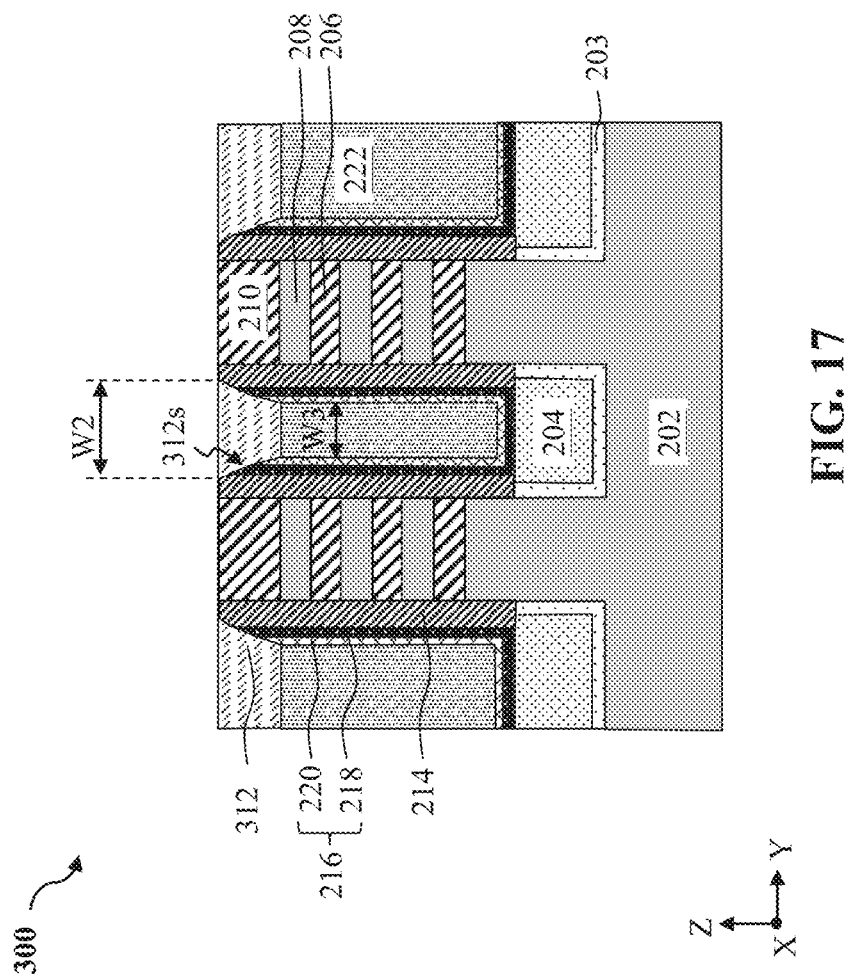

Referring to FIGS. 1 and 17, method 100 includes a block 114 where the helmet layer 312 is formed in the trench 310. The composition and formation of the helmet layer 312 may be in a way similar to those of the helmet layer 228 described with reference to FIG. 9. It is noted that, the helmet layer 312 tracks the shape of the trench 310 and has a tapered sidewall 312s. Put differently, a bottom surface of the helmet layer 312 aligns with a top surface of the recessed dielectric filler layer 222 and thus has a width W3, a width W2 of a top surface of the helmet layer 312 is greater than width W3 and coplanar with a top surface of the topmost layer 210, a sidewall surface of the helmet layer 312 is in direct contact with both the first film 218 and second film 220 of the hybrid film 216 and the cladding layer 214.

Figure 18:
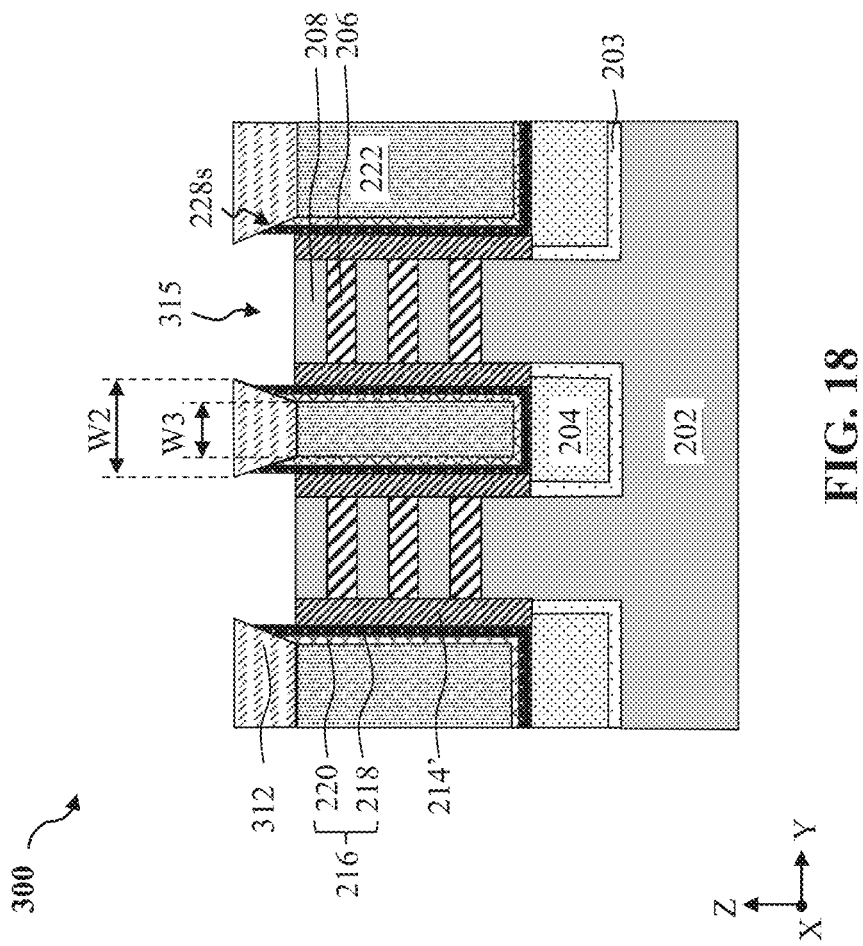

Referring to FIGS. 1 and 18, method 100 includes a block 116 where the topmost layer 210 and a portion of the cladding layer 214 extending along the sidewalls of the topmost layer 210 are selectively removed to expose the topmost channel layer 208 of the stack 207 by a suitable etching process. In an embodiment, the etching process may include a dry etching process. In some embodiments, top surfaces of the cladding layer 214' and the topmost channel layer 208 are substantially coplanar. The processes described in block 116, 118 and 120 (e.g., forming the dummy gate stack 234, inner spacer features 238, source/drain features 240, and the CESL 242 and ILD 244, and selectively removing the dummy gate stack 234) are omitted for reason of simplicity. Different from that of the workpiece 200 in FIG. 10, the trench 315 in workpiece 300 exposes at least a portion of the soft film 218.

Figure 19:
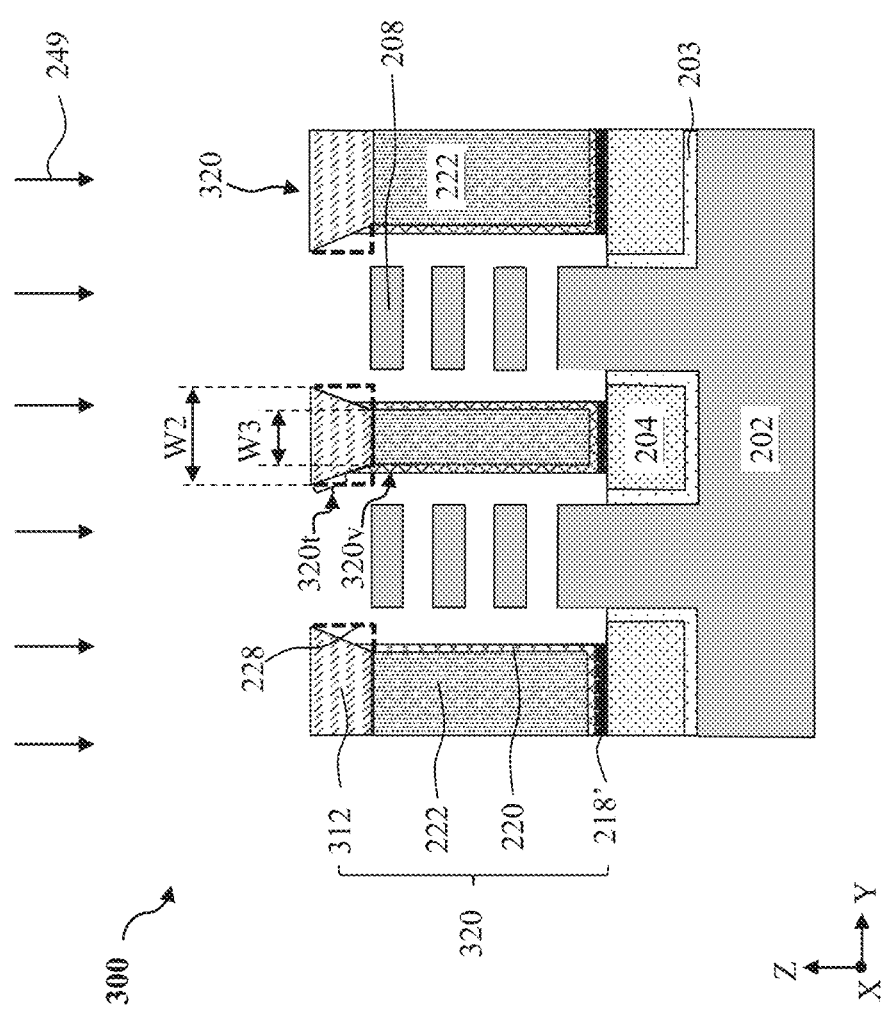

Referring to FIGS. 1 and 19, method 100 includes a block 122 where the sacrificial layers 206 the cladding layer 214' and a portion of the soft film 218 that extends along the sidewall of the cladding layer 214' are selectively removed to release the channel layers 208 by the etching process 249. Since the trench 315 exposes at least a portion of the soft film 218, the flow path for the etchant used in the channel release process is further enlarged, thereby facilitating the etching efficiency, reducing or even substantially eliminating SiGe residues in the channel region 205C. As shown in FIG. 19, the corresponding dielectric fin 320 in workpiece 300 is different from that of the dielectric fin 230' (shown in FIG. 13A) in workpiece 200. For example, a sidewall surface of the dielectric fin 320 has a tapered top portion 320t and a substantially vertical bottom portion 320v. The tapered top portion 320t is a part of the tapered sidewall 312s of the helmet layer 312 not covered by the hard film 220. That is, the hard film 220 is not only in direct contact with the sidewall and bottom surface of the dielectric filler layer 222, but also in direct contact with a bottom sidewall portion of the helmet layer 312. In this depicted example, a shape of a cross-sectional view of the helmet layer 312 includes an inverted trapezoid. It is understood that, due to the implementation of different etching processes, the shape of the helmet layer 312 may be slightly different, but at least a portion of the helmet layer 312 would overhang the hard film 220. Due to the formation of the denser oxide liner 203, the etching process 249 would not significantly etch the liner 203, thereby providing a satisfactory gate structure 254. It is noted that, in FIG. 19, the soft film 218' is also sandwiched between the isolation structure 204 and a horizontal or bottom portion of the hard film 220.

Figure 20:
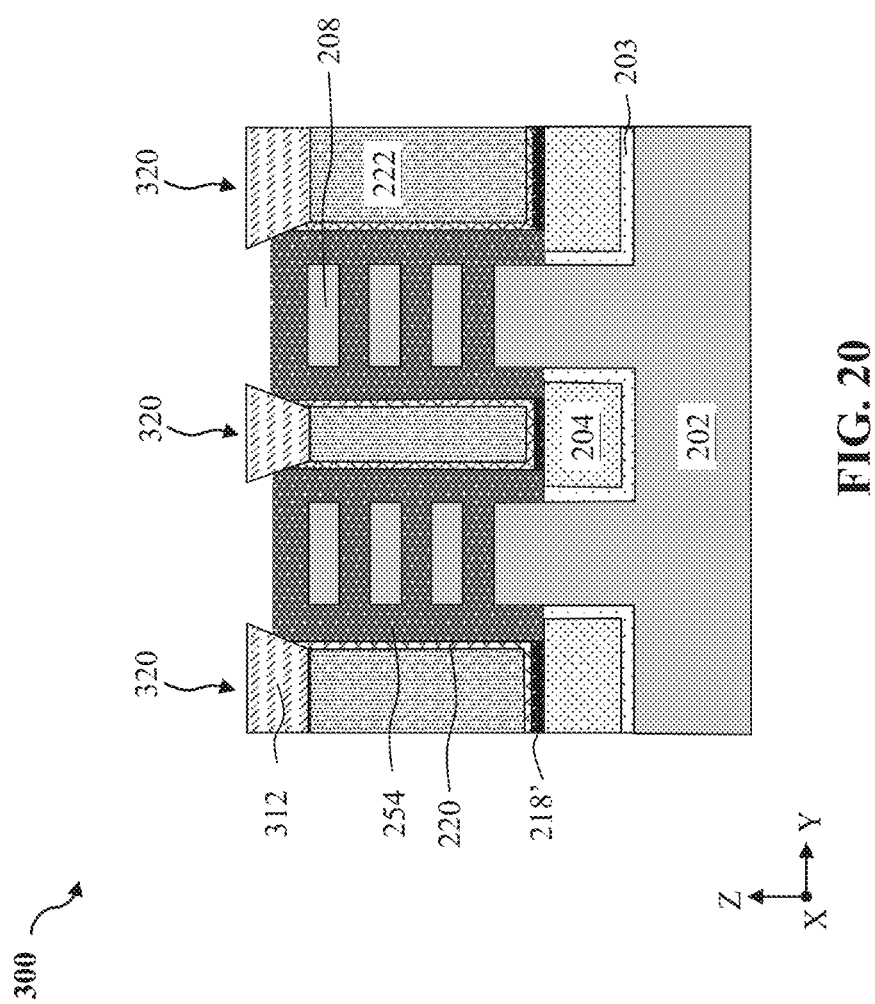

Referring to FIGS. 1 and 20, method 100 includes a block 124 where a gate structure 254 is formed over the workpiece 300. The helmet layer 312 still overhangs a portion of the gate structure 254. The gate structure 254 may also include a tilted portion in direct contact with a portion of the tapered sidewall 312s of the helmet layer 312.

Figure 21:
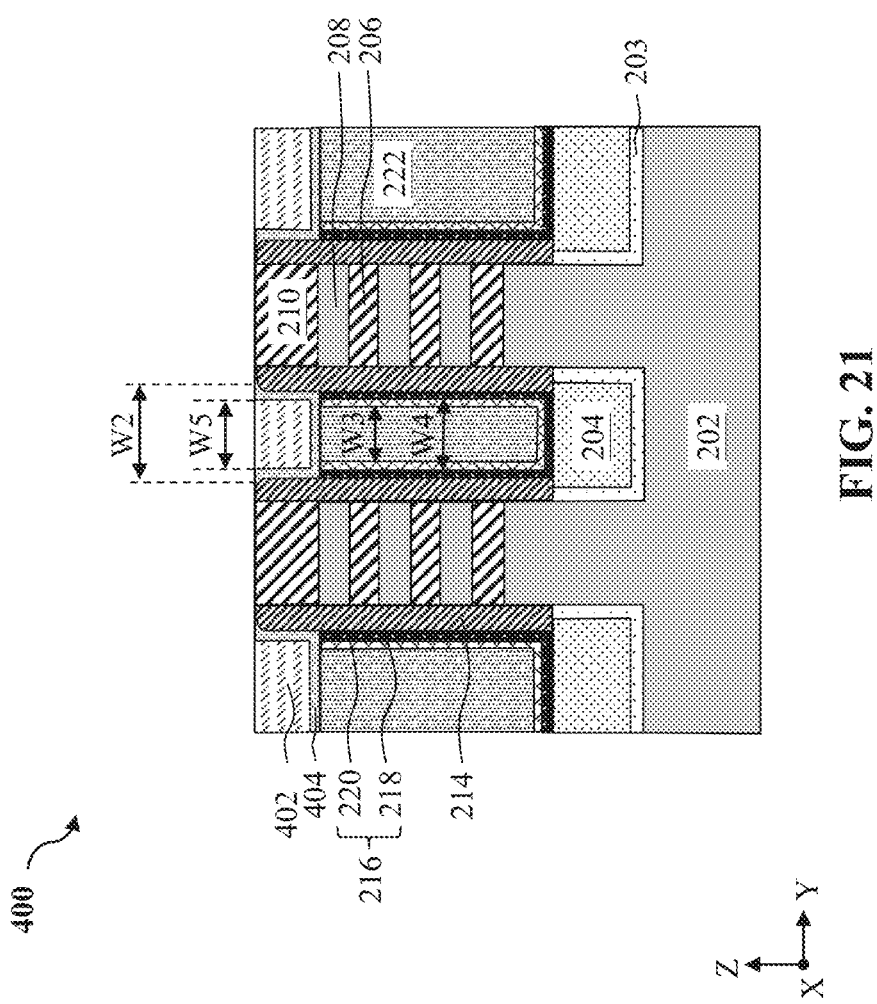

FIGS. 21-24 illustrate a second alternative embodiment of an exemplary workpiece 400 taken along line A-A' as shown in FIG. 2 during various fabrication stages in the method of FIG. 1. Referring to FIGS. 1 and 21, method 100 includes a block 114 where the helmet layer 402 is formed in the trench 226 (shown in FIG. 8). Before forming the helmet layer 402, a second soft film 404 is conformally deposited over the trench 226. A width of the second soft film 404 may be smaller than a width (e.g., T2+T3) of the hybrid film 216. The formation and material of the second soft film 404 may be in a way similar to those of the soft film 218. In an embodiment, a composition of the second soft film 404 is same to a composition of the soft film 218. In some other implementations, a composition of the second soft film 404 is different than a composition of the soft film 218. The helmet layer 402 is then deposited over the second soft film 404 and fill the trench 226. The composition and formation of the helmet layer 402 may be in a way similar to those of the helmet layer 228 described with reference to FIG. 9. A planarization process may be performed to remove excessive materials and expose a top surface of the topmost layer 210. It is noted that, due to the formation of the second soft film 404, a width W5 of the helmet layer 402 is smaller than a width W2 of the helmet layer 228 in workpiece 200. The width W5 may be substantially equal to or greater than the width W3 to provide a satisfactory isolation between multiple portions of the to-be-formed gate structure while also provide an enlarged flow path for channel release process.

Figure 22:
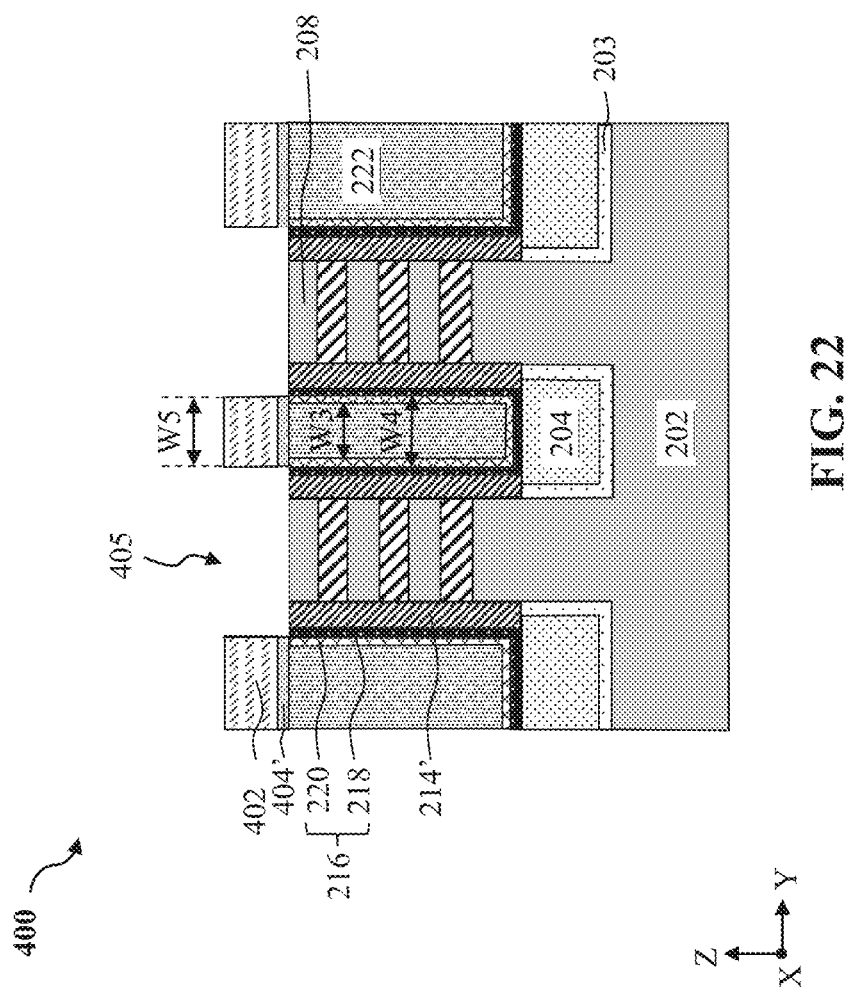

Referring to FIGS. 1 and 22, when the workpiece 400 undergoes operations at block 116 of method 100, the topmost layer 210, a portion of the cladding layer 214 extending along the sidewalls of the topmost layer 210, and a portion of the second soft film 404 in direct contact with the cladding layer 214 are selectively removed to expose the topmost channel layer 208 of the stack 207 and form a trench 405. A width of the trench 405 is greater than that of the trench 246 shown in FIG. 12A. The cladding layer 214' and the topmost channel layer 208 are substantially coplanar. The remained second soft film 404 after this selective etching process may be referred to as second soft film 404'. The second soft film 404' is disposed directly under the helmet layer 402. The trench 405 exposes at least a portion of the top surface of the soft film 218.

Figure 23:
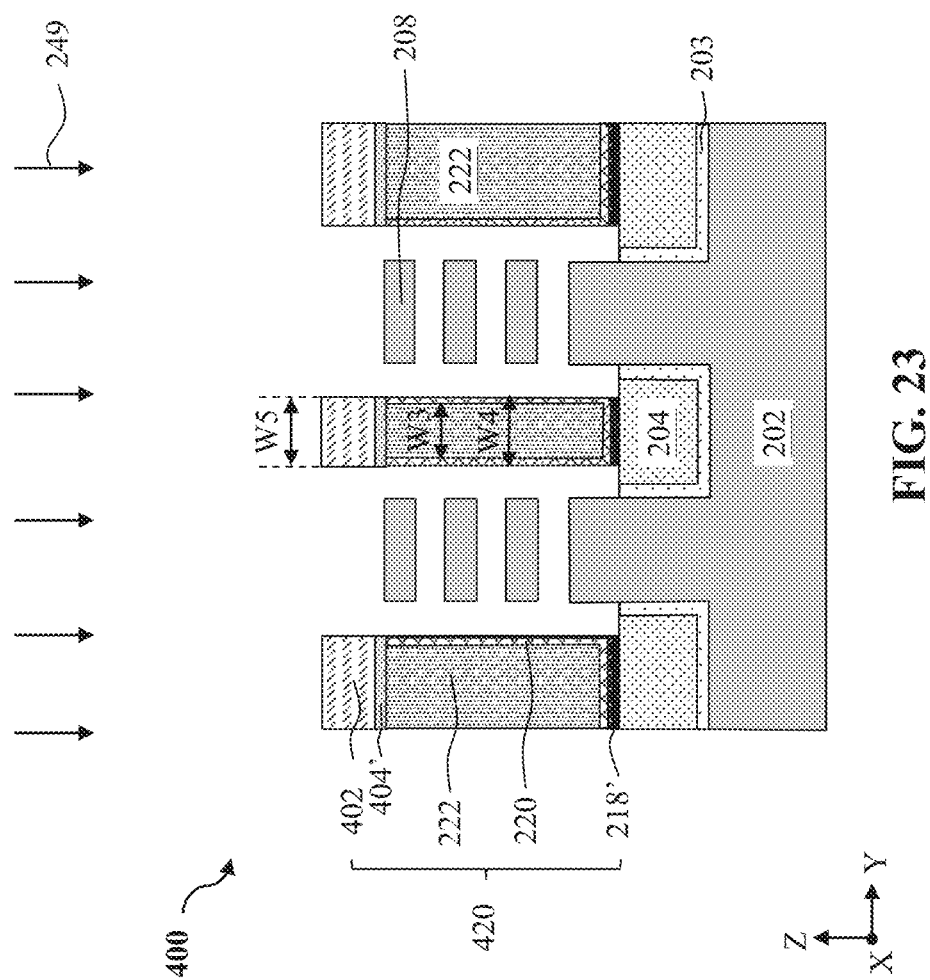

Referring to FIGS. 1 and 23, method 100 includes a block 122 where the sacrificial layers 206, the cladding layer 214', and a portion of the soft film 218 that extends along the sidewall of the cladding layer 214' are selectively removed to release the channel layers 208 as channel members 208 by the etching process 249. Since the helmet layer 402 has a width W5 smaller than the width W2 of the helmet layer 228 and at least a portion of the top surface of the soft film 218 is exposed by the trench 405, without changing the footprint, the flow path for the etchant used in the channel release process is enlarged, thereby facilitating the etching efficiency, reducing or even substantially eliminating SiGe residues in the channel region 205C.

Figure 24:
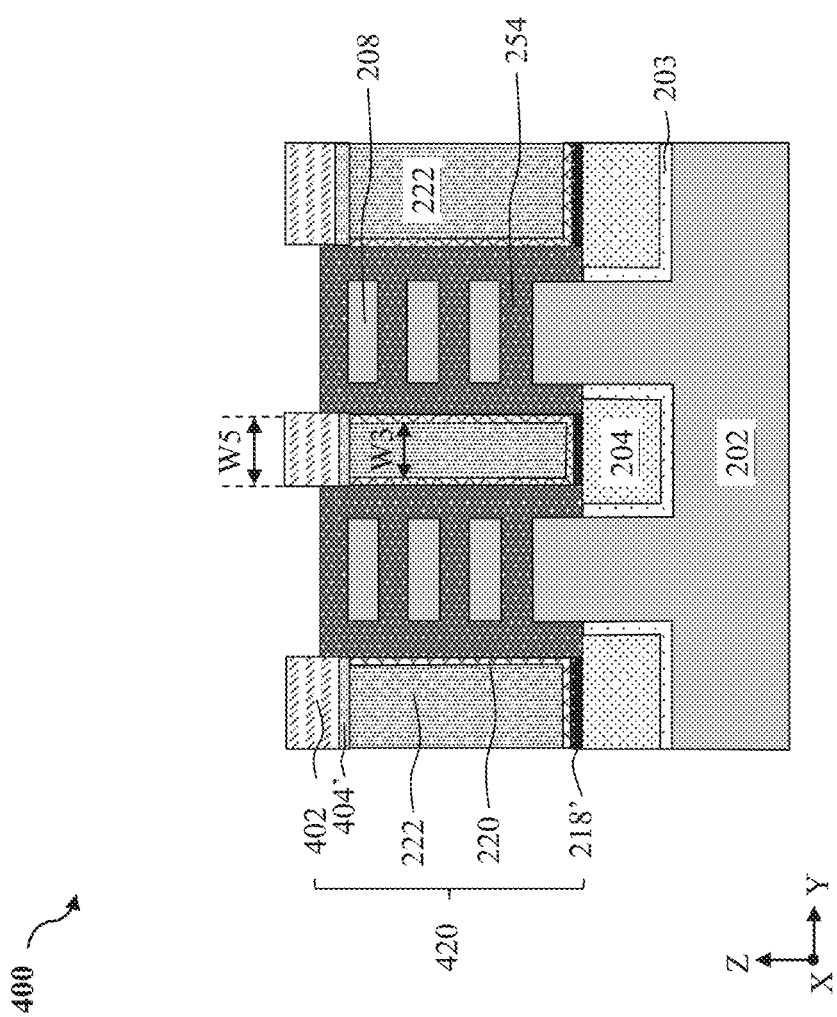

Referring to FIGS. 1 and 24, method 100 includes a block 124 where a gate structure 254 is formed over the workpiece 300. A final structure of the corresponding dielectric fin 420 in workpiece 400 is different from that of the dielectric fin 230' in workpiece 200. For example, the dielectric fin 420 also includes a second soft film 404' disposed directly on a top surface of the dielectric filler layer 222 and the hard film 220. When the width W5 is substantially equal to W4, the width of dielectric fin 420 is substantially uniform, and the gate structure 254 is in direct contact and in parallel with the dielectric fin 420. More specifically, the soft film 218', the hard film 220, the soft film 404', and the helmet layer 402 are in direct contact with the gate structure 254.

Figure 25:
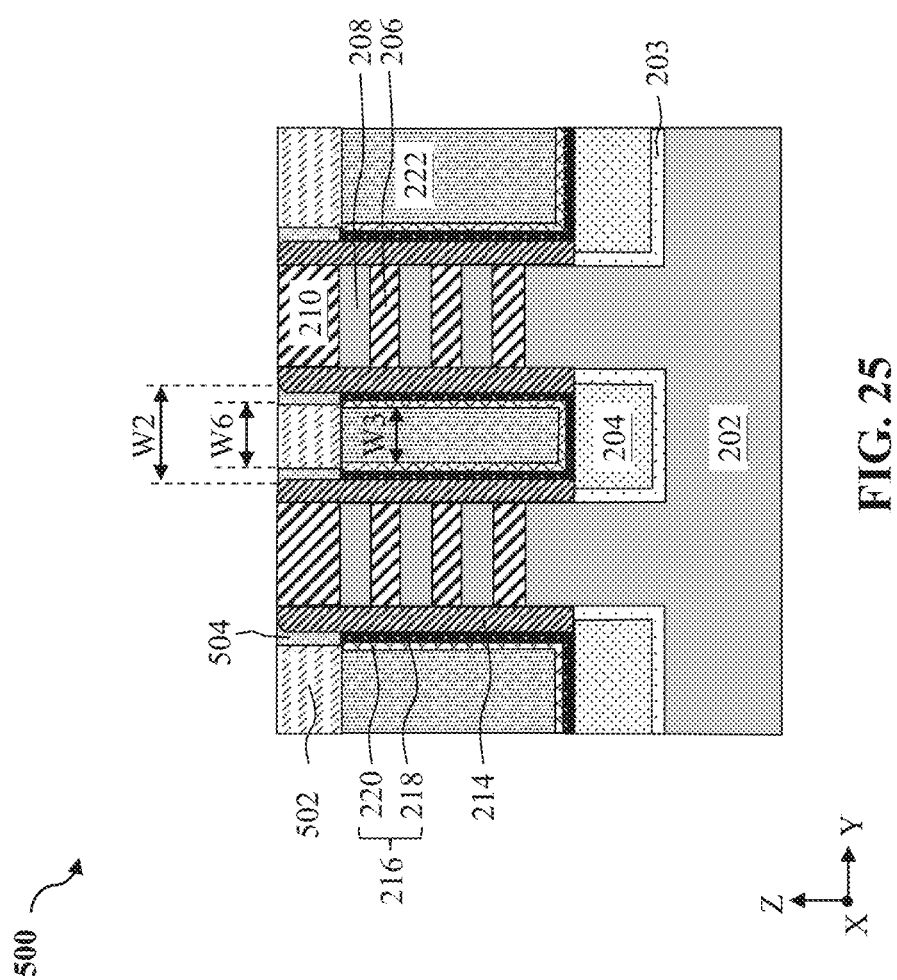

FIGS. 25-28 illustrate a third alternative embodiment of an exemplary workpiece 500 taken along line A-A' as shown in FIG. 2 during various fabrication stages in the method of FIG. 1. Referring to FIGS. 1 and 25, method 100 includes a block 114 where the helmet layer 502 is formed in the trench 226 (shown in FIG. 8). Before forming the helmet layer 502 in the trench 226, a third soft film 504 is deposited over the workpiece 500 and is then etched back to only cover sidewalls of the portion of the cladding layer 214 exposed in the trench 226. The formation and material of the third soft film 504 may be in a way similar to those of the soft film 218. The helmet layer 502 is then deposited over the workpiece 500 and fill the trench 226. The composition and formation of the helmet layer 502 may be in a way similar to those of the helmet layer 228 described with reference to FIG. 9. A planarization process may be performed to remove excessive materials and expose a top surface of the topmost layer 210. It is noted that, due to the formation of the third soft film 504, a width W6 of the helmet layer 502 is smaller than a width W2 of the helmet layer 228. The width W6 may be substantially equal to the width W3 to provide a satisfactory isolation between multiple portions of the to-be-formed gate structure while also provide an enlarged flow path for channel release process.

Figure 26:
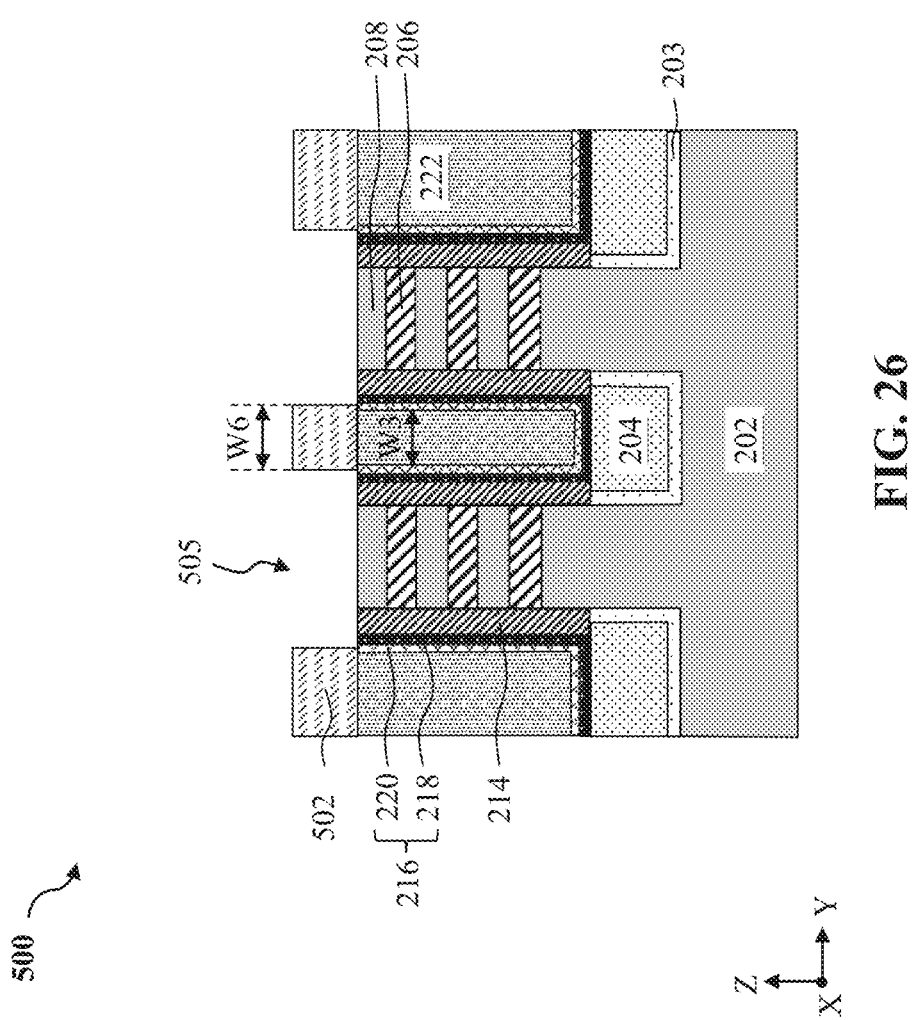

Referring to FIGS. 1 and 26, the topmost layer 210 is selectively removed to expose the topmost channel layer 208 of the stack 207. In this selective etching process, a portion of the cladding layer 214 extending along the sidewalls of the topmost layer 210 and the entire third soft film 504 are also selectively removed to form a trench 505. Due to the formation and removal of the third soft film 504, a width of the trench 505 is greater than the width $W_t$ (shown in FIG. 10) of the trench 232. The cladding layer 214' and the topmost channel layer 208 are substantially coplanar. The trench 505 exposes at least a portion of the top surface of the soft film 218.

Figure 27:
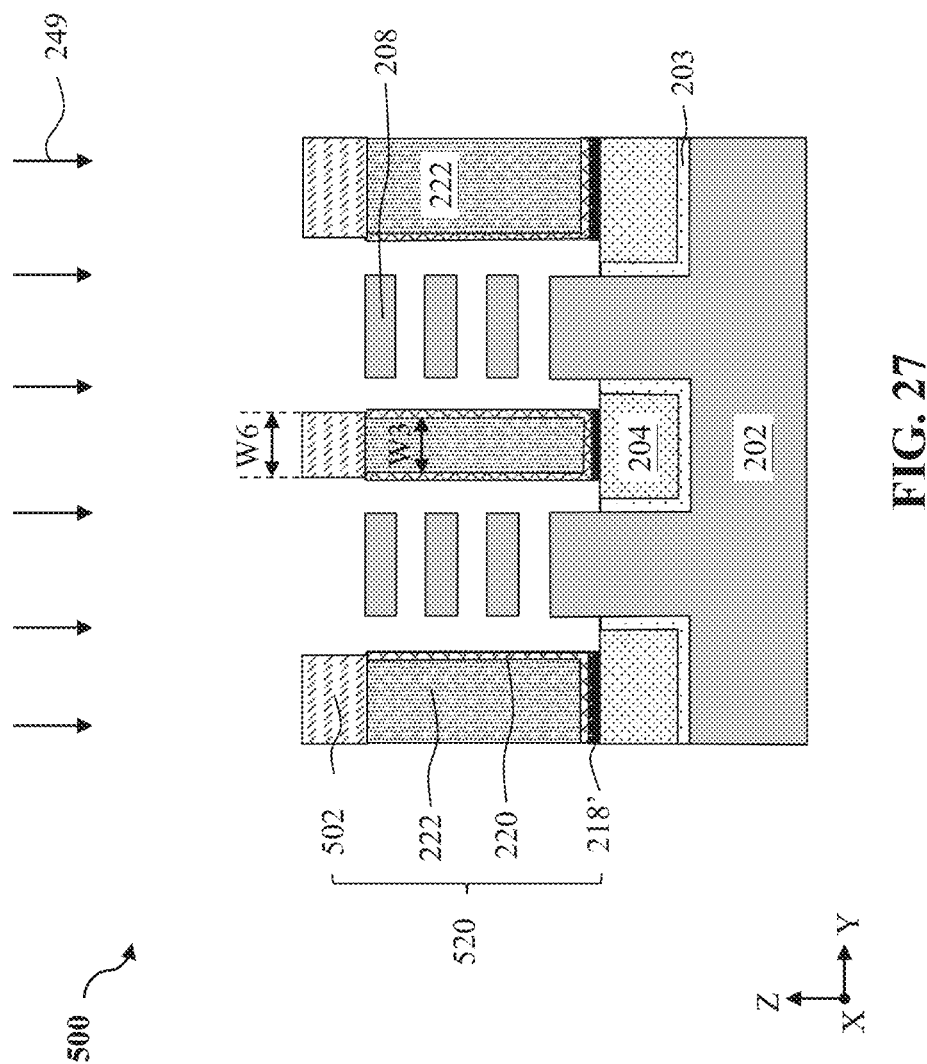

Referring to FIGS. 1 and 27, method 100 includes a block 122 where the sacrificial layers 206, the cladding layer 214', and a portion of the soft film 218 that extends along the sidewall of the cladding layer 214' are selectively removed to release the channel layers 208 by the etching process 249. Since the helmet layer 502 has a width W6 smaller than the width W2 of the helmet layer 228, the flow path for the etchant used in the channel release process is enlarged, thereby facilitating the etching efficiency, reducing or even substantially eliminating residues in the channel region 205C.

Figure 28:
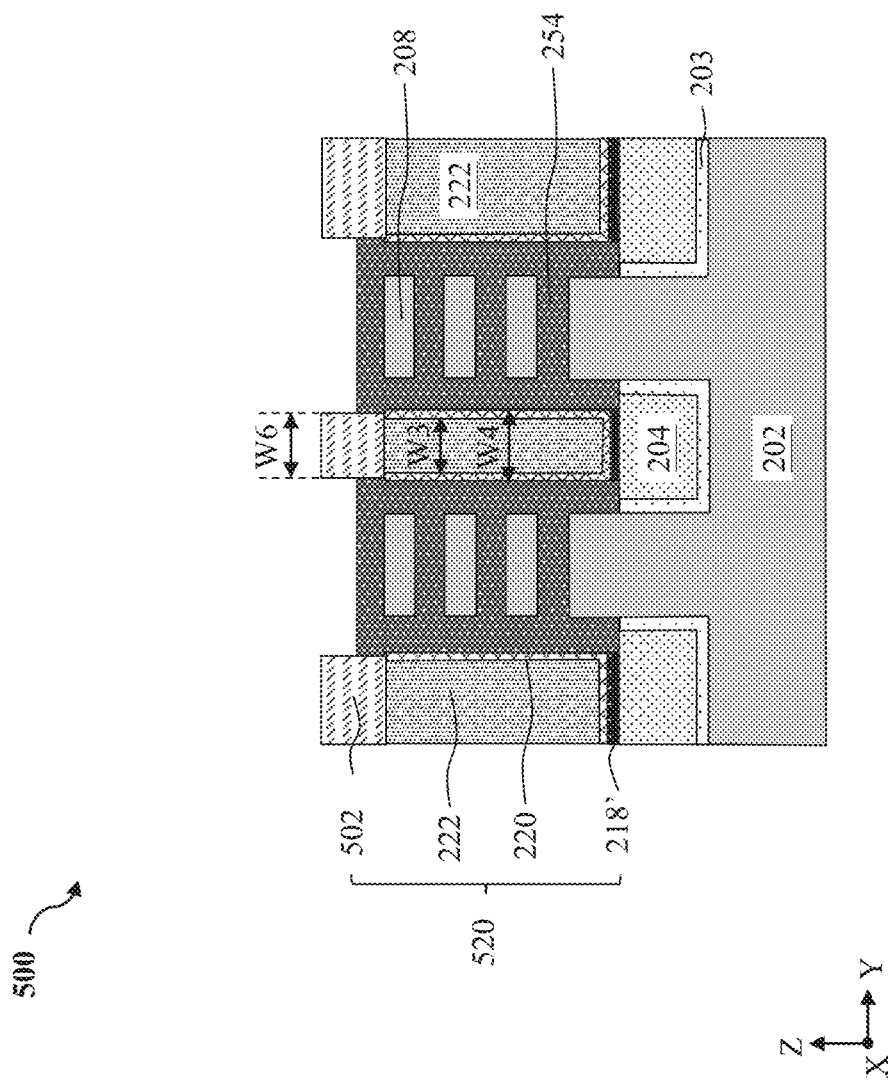

Referring to FIGS. 1 and 28, method 100 includes a block 124 where a gate structure 254 is formed over the workpiece 300. A final structure of the corresponding dielectric fin 520 in workpiece 500 is different from that of the dielectric fin 230' in workpiece 200. In an embodiment, W6 may be greater than W3 and smaller than W4. That is, a portion of the gate structure 254 is disposed directly on the hard film 220.

Although not intended to be limiting, one or more embodiments of the present disclosure provide many benefits to a semiconductor device and the formation thereof. For example, the present disclosure provides isolation structures configured to truncate a gate structure into multiple pieces, and methods of forming the same. The methods employ a hybrid film including two films having different etching rates with respect to an etching process employed in the channel release process. By selectively removing a portion of the hybrid film, the etching window for the channel release process would be enlarged without sacrificing the width of the channel members or substantially affecting the electrical isolation between two adjacent pieces of the gate structure. Embodiments of the disclosed methods can be readily integrated into existing processes and technologies for manufacturing MBC FETS, FinFETs, and/or other suitable devices.

The present disclosure provides for many different embodiments. Semiconductor structures and methods of fabrication thereof are disclosed herein. In one exemplary aspect, the present disclosure is directed to a semiconductor structure. The semiconductor structure includes a first number of channel members over a substrate, a first gate structure wrapping around each of the first number of channel members, and a dielectric fin structure disposed adjacent to the first gate structure. The dielectric fin structure includes a first dielectric layer disposed over the substrate and in direct contact with the first gate structure, a second dielectric layer disposed over the first dielectric layer, a third dielectric layer disposed over the second dielectric layer and spaced apart from the first dielectric layer and the first gate structure by the second dielectric layer, and a first isolation feature disposed directly over the third dielectric layer.

In some embodiments, a portion of the first gate structure may be disposed directly under the first isolation feature. In some embodiments, the semiconductor structure may also include a second number of channel members over the substrate, and a second gate structure wrapping around each of the second number of channel members, the first gate structure and the second gate structure may be separated by the dielectric fin structure.

In some embodiments, the semiconductor structure may also include a second isolation feature disposed over the substrate. The dielectric fin structure may be disposed over and in direct contact with the second isolation feature.

In some embodiments, the second isolation feature may include an oxide liner and an oxide filler layer disposed over the oxide liner. A portion of the first gate structure may be in direct contact with the oxide liner.

In some embodiments, a carbon concentration of the second dielectric layer may be greater than a carbon concentration of the first dielectric layer. In some embodiments, the first dielectric layer may include silicon nitride (SiN) or silicon oxycarbonitride (SiOCN). In some embodiments, the second dielectric layer may include silicon carbonitride (SiCN), silicon carbon oxynitride (SiOCN), or boron nitride (BN).

In some embodiments, the dielectric fin structure may include a fourth dielectric layer disposed between the third dielectric layer and the first isolation feature, the fourth dielectric layer may include silicon nitride or silicon oxycarbonitride.

In another exemplary aspect, the present disclosure is directed to a semiconductor structure. The semiconductor structure includes a first number of nanostructures and a second number of nanostructures over a substrate and extending lengthwise along a first direction, a first isolation feature disposed between the first number of nanostructures and the second number of nanostructures and extending lengthwise along the first direction, and a second isolation feature disposed directly over the first isolation feature. The second isolation feature overhangs the first isolation feature along a second direction perpendicular to the first direction.

The semiconductor structure may also include a first gate structure wrapping around each of the first number of nanostructures, and a second gate structure wrapping around each of the second number of nanostructures. The second gate structure may be separated from the first gate structure by the first isolation feature and the second isolation feature, the first gate structure and second gate structure each may include a portion disposed directly under the second isolation feature.

In some embodiments, the first isolation feature may include a first dielectric layer disposed over substrate, a second dielectric layer disposed over the first dielectric layer, and a third dielectric layer disposed on sidewalls of the second dielectric layer. The second dielectric layer may be spaced apart from the first and the second gate structures by the third dielectric layer.

In some embodiments, an etch rate of the first dielectric layer may be greater than an etch rate of the third dielectric layer with respect to a wet etching process including use of ammonium hydroxide and hydrofluoric acid. In some embodiments, the first and second gate structures each may include a top surface lower than a top surface of the second isolation feature.

The semiconductor structure may also include a source feature and a drain feature. The first number of nanostructures may be extending between the source feature and the drain feature along the first direction. In some embodiments, the second isolation feature may include a tapered sidewall.

In yet another exemplary aspect, the present disclosure is directed to a method. The method includes forming a number of semiconductor fin-shape stacks protruding from a substrate, each of the number of semiconductor fin-shape stacks may also include a vertical stack of alternating first semiconductor layers and second semiconductor layers, forming a cladding layer along sidewalls of each of the number of semiconductor fin-shape stacks, conformally depositing a hybrid film layer over the substrate, the hybrid film layer comprising a first film layer and a second film layer on the first film layer, forming a first dielectric layer over the substrate to fill space between two adjacent semiconductor fin-shape stacks, selectively recessing the first dielectric layer and the hybrid film layer to form a trench, forming an isolation feature in the trench, selectively removing the cladding layer, a portion of the first film layer extending along sidewalls of the cladding layer, and the second semiconductor layers to form openings, and forming a gate structure in the openings.

In some embodiments, after the selectively recessing of the first dielectric layer, a top surface of the hybrid film layer may be substantially coplanar with a topmost first semiconductor layer of the number of semiconductor fin-shape stacks.

In some embodiments, the forming of the isolation feature in the trench may include conformally depositing a second dielectric layer over the substrate, forming a third dielectric layer over the second dielectric layer, and performing a planarization process to remove excessive materials and expose a top surface of the cladding layer. The second dielectric layer may include silicon nitride or silicon oxycarbonitride.

In some embodiments, the method may also include forming a topmost sacrificial layer directly over each of the number of semiconductor fin-shape stacks before the conformally depositing of the hybrid film layer, selectively removing the topmost sacrificial layer and a portion of the cladding layer in direct contact with the topmost sacrificial layer after the forming of the isolation feature in the trench, and performing an etching process to selectively remove the rest of the cladding layer, the portion of the second film layer extending along sidewalls of the cladding layer, and the second semiconductor layers to form the openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first plurality of channel members over a substrate;
   a first gate structure wrapping around each of the first plurality of channel members; and
   a dielectric fin structure disposed adjacent to the first gate structure, the dielectric fin structure comprising:
     a first dielectric layer disposed over the substrate and in direct contact with the first gate structure,
     a second dielectric layer disposed over the first dielectric layer, wherein a carbon concentration of the second dielectric layer is greater than a carbon concentration of the first dielectric layer,
     a third dielectric layer disposed over the second dielectric layer and spaced apart from the first dielectric layer and the first gate structure by the second dielectric layer, and
     a first isolation feature disposed directly over the third dielectric layer.

2. The semiconductor structure of claim 1, wherein a portion of the first gate structure is disposed directly under the first isolation feature.

3. The semiconductor structure of claim 1, further comprising:
   a second plurality of channel members over the substrate; and
   a second gate structure wrapping around each of the second plurality of channel members, wherein the first gate structure and the second gate structure are separated by the dielectric fin structure.

4. The semiconductor structure of claim 1, further comprising:
   a second isolation feature disposed over the substrate, wherein the dielectric fin structure is disposed over and in direct contact with the second isolation feature.

5. The semiconductor structure of claim 4,
   wherein the second isolation feature comprises an oxide liner and an oxide filler layer disposed over the oxide liner,
   wherein a portion of the first gate structure is in direct contact with the oxide liner.

6. The semiconductor structure of claim 1, wherein the first dielectric layer comprises silicon nitride (SiN) or silicon oxycarbonitride (SiOCN).

7. The semiconductor structure of claim 1, wherein the second dielectric layer comprises silicon carbonitride (SiCN), silicon carbon oxynitride (SiOCN), or boron nitride (BN).

8. The semiconductor structure of claim 1, wherein the dielectric fin structure further comprises a fourth dielectric layer disposed between the third dielectric layer and the first isolation feature, the fourth dielectric layer comprises silicon nitride or silicon oxycarbonitride.

9. A semiconductor structure, comprising:
   a first plurality of nanostructures and a second plurality of nanostructures over a substrate and extending lengthwise along a first direction;
   a first gate structure wrapping around and over at least one nanostructure of the first plurality of nanostructures and comprising a gate electrode over a gate dielectric layer;
   a first isolation feature disposed between the first plurality of nanostructures and the second plurality of nanostructures and extending lengthwise along the first direction; and
   a second isolation feature disposed directly over the first isolation feature,
   wherein the second isolation feature overhangs the first isolation feature along a second direction perpendicular to the first direction, and wherein a bottom surface of the second isolation feature is below a topmost surface of the first gate structure, and a top surface of the second isolation feature is above the topmost surface of the first gate structure.

10. The semiconductor structure of claim 9, further comprising:
    a second gate structure wrapping around each of the second plurality of nanostructures, the second gate structure being separated from the first gate structure by the first isolation feature and the second isolation feature,
    wherein the first gate structure and second gate structure each comprise a portion disposed directly under the second isolation feature.

11. The semiconductor structure of claim 10, wherein the first isolation feature comprises:
    a first dielectric layer disposed over substrate;
    a second dielectric layer disposed over the first dielectric layer; and
    a third dielectric layer extending along both sidewalls and bottom surface of the second dielectric layer,
    wherein the second dielectric layer is spaced apart from the first and the second gate structures by the third dielectric layer.

12. The semiconductor structure of claim 11, wherein an etch rate of the first dielectric layer is greater than an etch rate of the third dielectric layer with respect to a wet etching process comprising use of ammonium hydroxide and hydrofluoric acid.

13. The semiconductor structure of claim 9, further comprising:

a source feature and a drain feature, wherein the first plurality of nanostructures are extending between the source feature and the drain feature along the first direction.

14. The semiconductor structure of claim 9, wherein the second isolation feature comprises a tapered sidewall.

15. A semiconductor structure, comprising:
a first transistor comprising a first gate structure;
a second transistor comprising a second gate structure, and
a dielectric feature configured to provide isolation between the first gate structure and the second gate structure and comprising:
  a lower portion,
  a middle portion over the lower portion and having a width substantially equal to a width of the lower portion, wherein composition of the lower portion is different from composition of an outer layer of the middle portion, and
  an upper portion overhanging the middle portion,
wherein, a portion of the first gate structure and a portion of the second gate structure are disposed directly under the upper portion of the dielectric feature.

16. The semiconductor structure of claim 15, wherein the lower portion of the dielectric feature comprises a dielectric layer, and the middle portion of the dielectric feature comprises a dielectric liner extending along bottom surface and sidewall surface of a dielectric filler, wherein composition of the dielectric liner is different from the composition of the dielectric filler, and
wherein, a sidewall surface of the first dielectric layer is aligned with a sidewall surface of the dielectric liner.

17. The semiconductor structure of claim 16, wherein the upper portion of the dielectric feature is formed of a material different from the first dielectric layer.

18. The semiconductor structure of claim 9, wherein the first isolation feature and the second isolation feature are disposed on a first side of the first plurality of nanostructures, the semiconductor structure further comprising:
a dielectric structure disposed on a second side of the first plurality of nanostructures, the second side being opposite the first side, wherein a portion of the first gate structure extends from the first plurality of nanostructures to the dielectric structure.

19. The semiconductor structure of claim 11, wherein the second dielectric layer is spaced apart from the first dielectric layer by the third dielectric layer.

20. The semiconductor structure of claim 15, wherein a top surface of the dielectric feature is above a topmost surface of the first gate structure.

* * * * *